US012796071B2

(12) United States Patent
Eom et al.

(10) Patent No.: US 12,796,071 B2
(45) Date of Patent: Nov. 10, 2026

(54) SEMICONDUCTOR DEVICE

(71) Applicant: SAMSUNG ELECTRONICS CO., LTD., Suwon-si (KR)

(72) Inventors: Byeol Hae Eom, Suwon-si (KR); Byung Ha Choi, Suwon-si (KR); Keun Hwi Cho, Suwon-si (KR); Sung Won Kim, Suwon-si (KR); Yuri Masuoka, Suwon-si (KR); Won Cheol Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 414 days.

(21) Appl. No.: 18/379,731

(22) Filed: Oct. 13, 2023

(65) Prior Publication Data

US 2024/0136356 A1 Apr. 25, 2024
US 2024/0234417 A9 Jul. 11, 2024

(30) Foreign Application Priority Data

Oct. 20, 2022 (KR) ........................ 10-2022-0135790

(51) Int. Cl.
*H10D 84/85* (2025.01)
*H10D 30/43* (2025.01)
(Continued)

(52) U.S. Cl.
CPC ............. *H10D 84/85* (2025.01); *H10D 30/43* (2025.01); *H10D 30/6729* (2025.01); *H10D 30/6735* (2025.01); *H10D 62/121* (2025.01)

(58) Field of Classification Search
CPC ............... H10D 84/85; H10D 84/0151; H10D 84/0128; H10D 84/038; H10D 84/83;
(Continued)

(56) References Cited

U.S. PATENT DOCUMENTS 6,963,115 B2 11/2005 Nakata et al.
9,899,364 B2 2/2018 Blatchford et al.
(Continued)

FOREIGN PATENT DOCUMENTS

KR 10-2012-0080889 A 7/2012

OTHER PUBLICATIONS

European Office Action dated Mar. 15, 2024 for corresponding application No. EP 23 199 555.6.
(Continued)

*Primary Examiner* — Marc-Anthony Armand
(74) *Attorney, Agent, or Firm* — Muir Patent Law, PLLC

(57) ABSTRACT

A semiconductor device includes a first element separation structure, a second element separation structure, and a third element separation structure sequentially disposed along a first direction and extending in a second direction intersecting the first direction; a first active pattern extending in the first direction between the first element separation structure and the second element separation structure; a second active pattern extending in the first direction between the second element separation structure and the third element separation structure and separated from the first active pattern by the second element separation structure; a first gate electrode extending in the second direction on the first active pattern; and a plurality of second gate electrodes extending in the second direction on the second active pattern, wherein a width of the first active pattern in the second direction is greater than a width of the second active pattern in the second direction.

20 Claims, 25 Drawing Sheets

(51) Int. Cl.
*H10D 30/67* (2025.01)
*H10D 62/10* (2025.01)

(58) Field of Classification Search
CPC .. H10D 84/853; H10D 30/43; H10D 30/6729; H10D 30/3735; H10D 30/014; H10D 30/62
See application file for complete search history.

(56) References Cited

U.S. PATENT DOCUMENTS

| | | | | |
|---|---|---|---|---|
| 10,199,378 | B2 | 2/2019 | Jain et al. | |
| 2017/0358565 | A1 | 12/2017 | Hensel et al. | |
| 2020/0083219 | A1* | 3/2020 | Kang | B82Y 10/00 |
| 2020/0381432 | A1* | 12/2020 | Lee | H10D 30/62 |
| 2021/0050854 | A1 | 2/2021 | Song et al. | |
| 2021/0165946 | A1 | 6/2021 | Chae et al. | |
| 2021/0167059 | A1* | 6/2021 | Lee | H10D 30/0243 |
| 2021/0357565 | A1 | 11/2021 | Fang et al. | |
| 2022/0005801 | A1 | 1/2022 | Lee et al. | |
| 2022/0310586 | A1 | 9/2022 | Jung et al. | |
| 2022/0320312 | A1 | 10/2022 | Park et al. | |

OTHER PUBLICATIONS

European Search Report dated Mar. 1, 2024 for corresponding application No. EP 23 199 555.6.

* cited by examiner

SEMICONDUCTOR DEVICE

CROSS-REFERENCE TO RELATED APPLICATION

This application claims priority from Korean Patent Application No. 10-2022-0135790, filed on Oct. 20, 2022, in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor device.

2. Description of the Related Art

As one of the scaling techniques for increasing density of semiconductor devices, a multi-gate transistor, in which a multi-channel active pattern (or silicon body) having a fin or nanowire shape is formed on a substrate and a gate is formed on a surface of the multi-channel active pattern, has been proposed. Since such a multi-gate transistor uses a three-dimensional channel, it is easy to perform scaling. In addition, the multi-gate transistor may improve current control capability even without increasing a length of the gate of the multi-gate transistor. In addition, the multi-gate transistor may effectively suppress a short channel effect (SCE) in which a potential of a channel region is affected by a drain voltage.

SUMMARY

According to an embodiment of the present disclosure, there is provided a semiconductor device including: a first element separation structure, a second element separation structure, and a third element separation structure sequentially disposed along a first direction and extending in a second direction intersecting the first direction; a first active pattern extending in the first direction between the first element separation structure and the second element separation structure; a second active pattern extending in the first direction between the second element separation structure and the third element separation structure and separated from the first active pattern by the second element separation structure; a first gate electrode extending in the second direction on the first active pattern; and a plurality of second gate electrodes extending in the second direction on the second active pattern, wherein a width of the first active pattern in the second direction is greater than a width of the second active pattern in the second direction.

According to an embodiment of the present disclosure, there is provided a semiconductor device including a first element separation structure; a second element separation structure spaced apart from the first element separation structure in a first direction; a first active pattern extending in the first direction between the first element separation structure and the second element separation structure; a second active pattern extending in the first direction and separated from the first active pattern by the second element separation structure; a first gate electrode extending in the second direction on the first active pattern; a second gate electrode extending in the second direction on the second active pattern; and a third gate electrode extending in the second direction on the second active pattern and spaced apart from the second gate electrode in the first direction, wherein the first element separation structure, the first gate electrode, the second element separation structure, the second gate electrode, and the third gate electrode are arranged at a first pitch along the first direction, and a width of the first active pattern in the second direction is greater than a width of the second active pattern between the second gate electrode and the third gate electrode in the second direction.

According to an embodiment of the present disclosure, there is provided a semiconductor device including a first element separation structure, a second element separation structure, and a third element separation structure sequentially disposed along a first direction and extending in a second direction intersecting the first direction; a first active pattern extending in the first direction between the first element separation structure and the second element separation structure; a second active pattern extending in the first direction between the second element separation structure and the third element separation structure and spaced apart from the first active pattern in the first direction; a third active pattern extending in the first direction between the first element separation structure and the second element separation structure and spaced apart from the first active pattern in the second direction; a fourth active pattern extending in the first direction between the second element separation structure and the third element separation structure and spaced apart from the third active pattern in the first direction; a first gate electrode extending in the second direction on the first active pattern and the third active pattern; and a plurality of second gate electrodes extending in the second direction on the second active pattern and the fourth active pattern, wherein the second active pattern includes a first portion between the second gate electrodes adjacent to each other in the first direction, the fourth active pattern includes a second portion between the second gate electrodes adjacent to each other in the first direction, a width of the first active pattern in the second direction is greater than a width of the first portion in the second direction, and a width of the third active pattern in the second direction is greater than a width of the second portion in the second direction.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
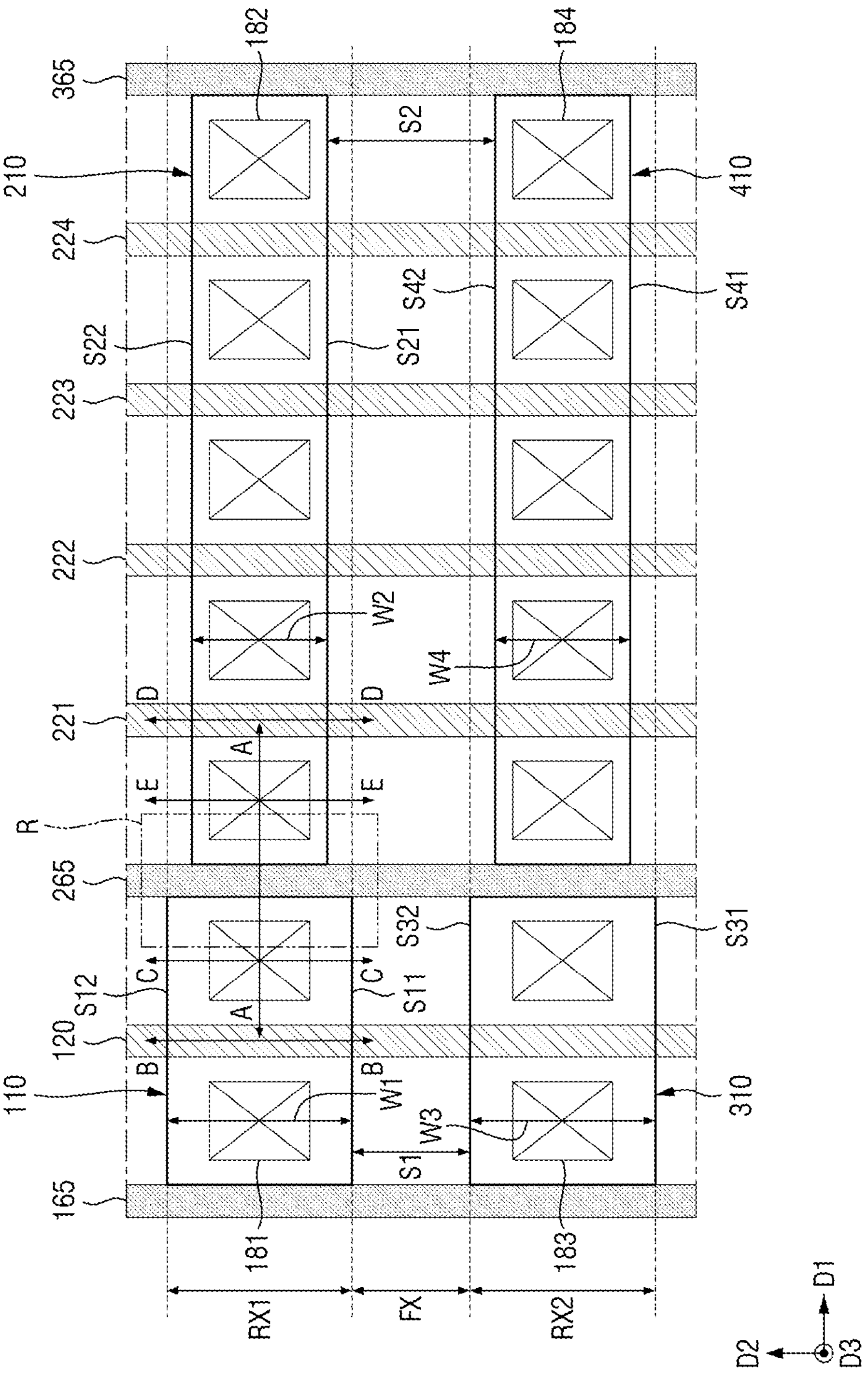
FIG. 1 is an exemplary layout view for describing a semiconductor device according to some exemplary embodiments.

In the drawings of a semiconductor device according to some exemplary embodiments, a fin-type transistor (FinFET) including a channel region having an active pattern shape, a transistor including nanowires or nanosheets, and a multi-bridge channel field effect transistor (MBCFET™) are exemplarily illustrated, but the present disclosure is not limited thereto. For example, the semiconductor device according to some exemplary embodiments may include a tunneling FET or a three-dimensional (3D) transistor. In another example, the semiconductor device according to some exemplary embodiments may include a planar transistor. In yet another example, exemplary embodiments may be implemented in two-dimensional (2D) material based FETs and a heterostructure thereof. In addition, the semiconductor device according to some exemplary embodiments may also include a bipolar junction transistor, a lateral double-diffused metal oxide semiconductor (LDMOS) transistor, or the like.

Figure 2:
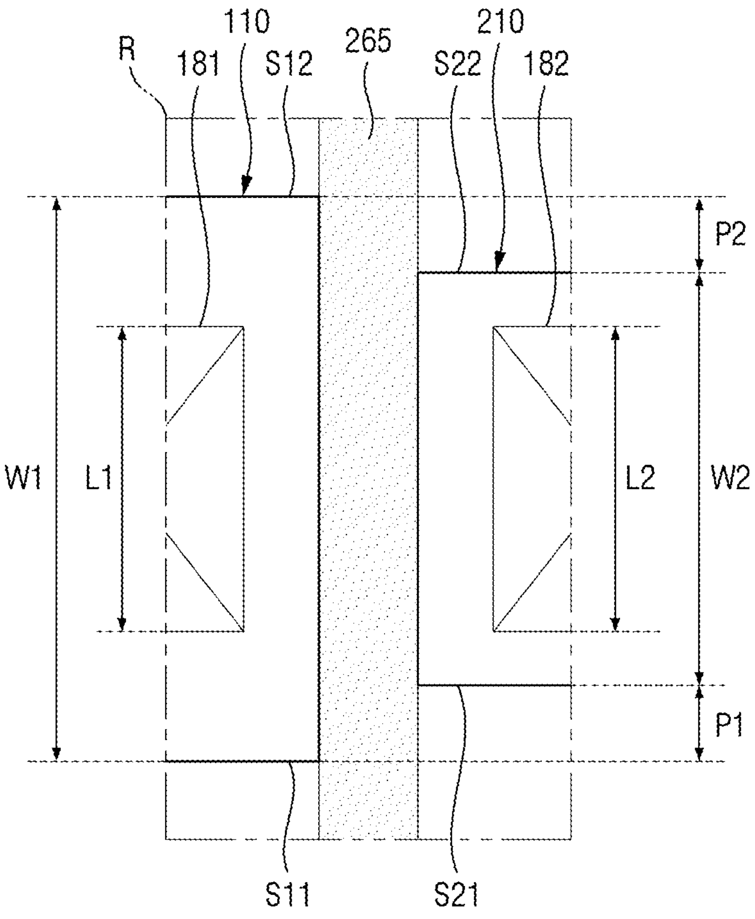
FIGS. 2 and 3 are enlarged views of region R of FIG. 1.
Figure 3:
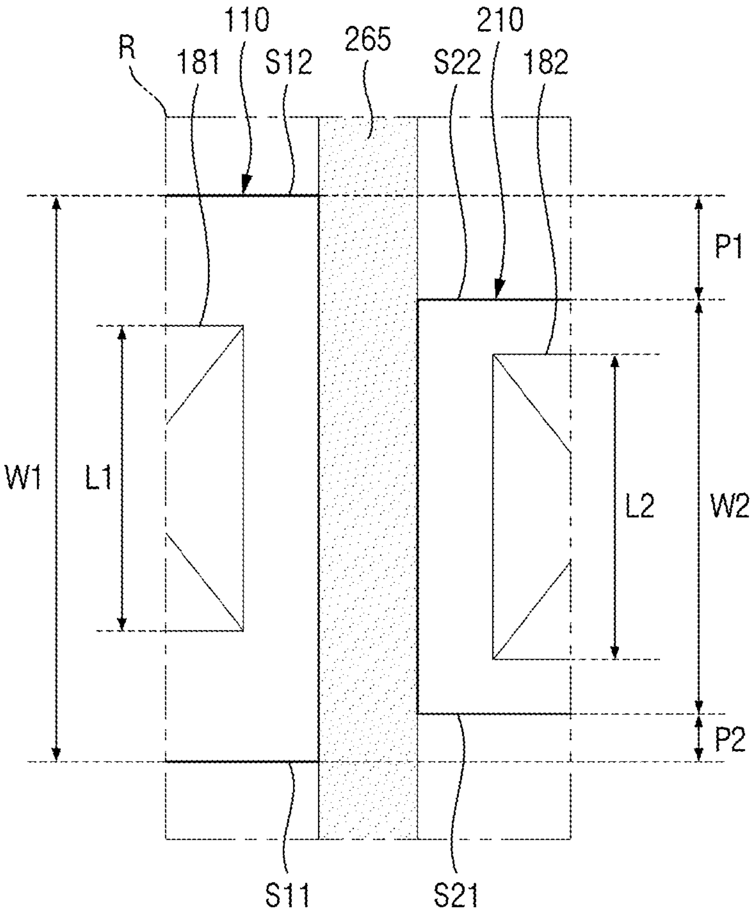
Figure 4:
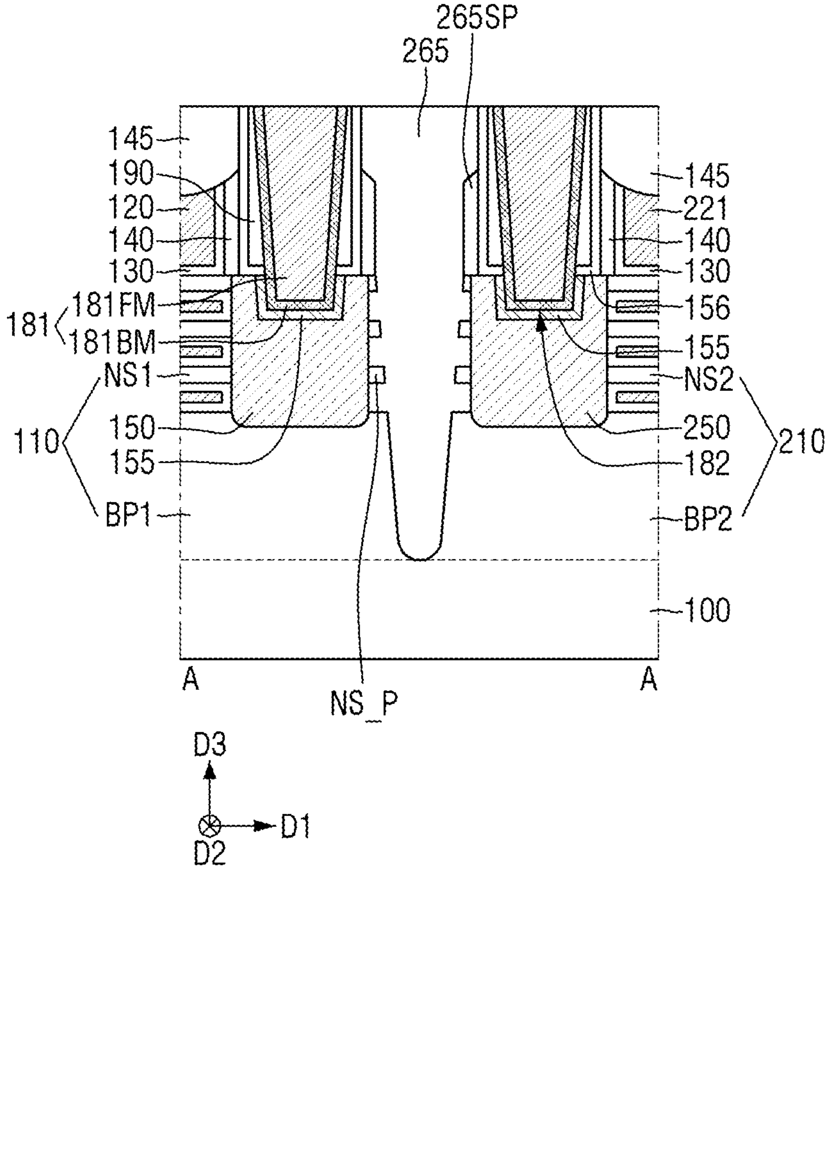
FIG. 4 is a cross-sectional view taken along line A-A of FIG. 1.
Figure 5:
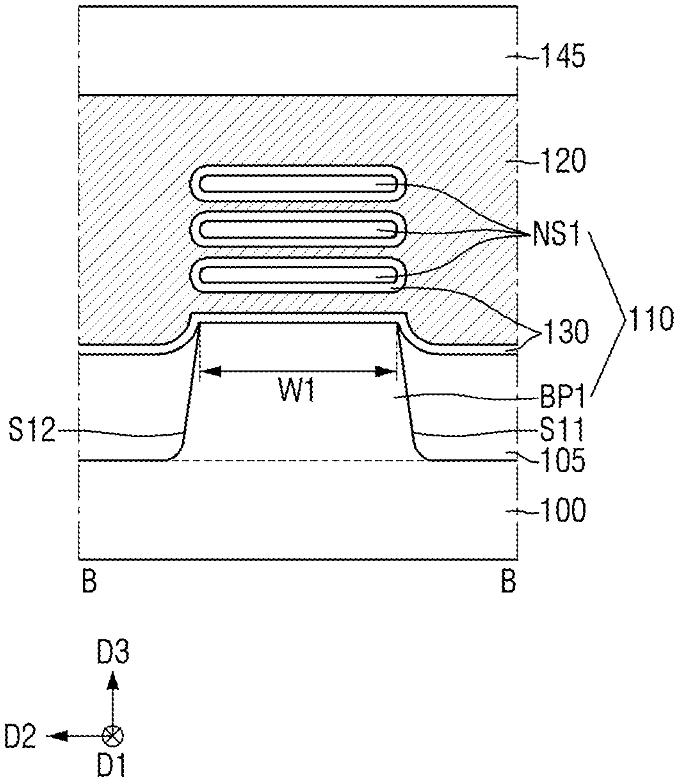
FIG. 5 is a cross-sectional view taken along line B-B of FIG. 1.
Figure 6:
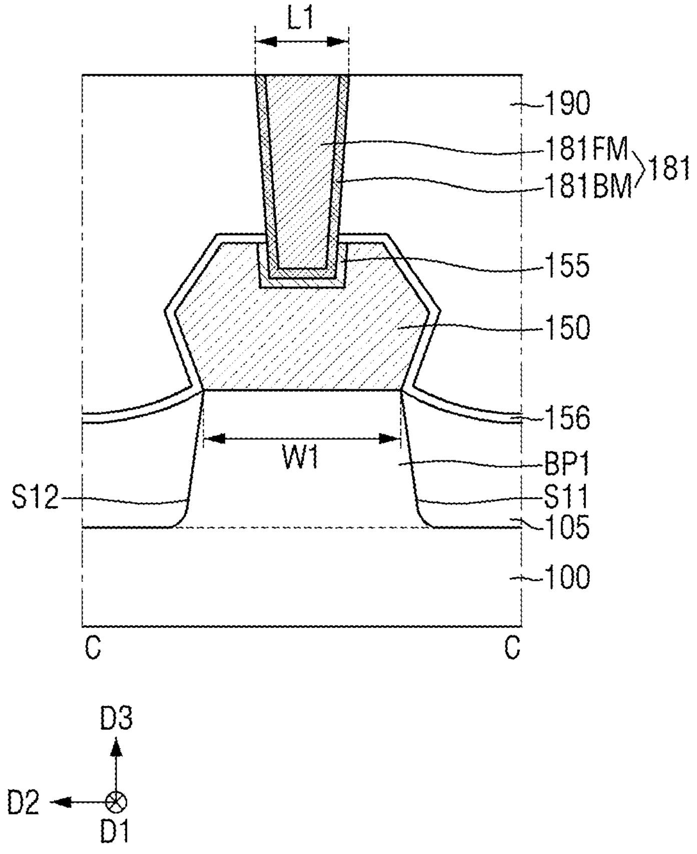
FIG. 6 is a cross-sectional view taken along line C-C of FIG. 1.
Figure 7:
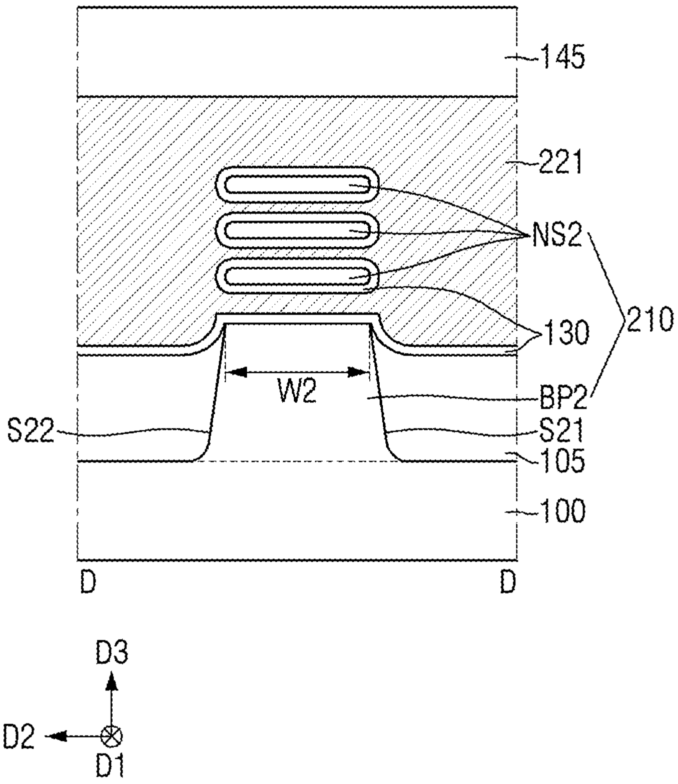
FIG. 7 is a cross-sectional view taken along line D-D of FIG. 1.
Figure 8:
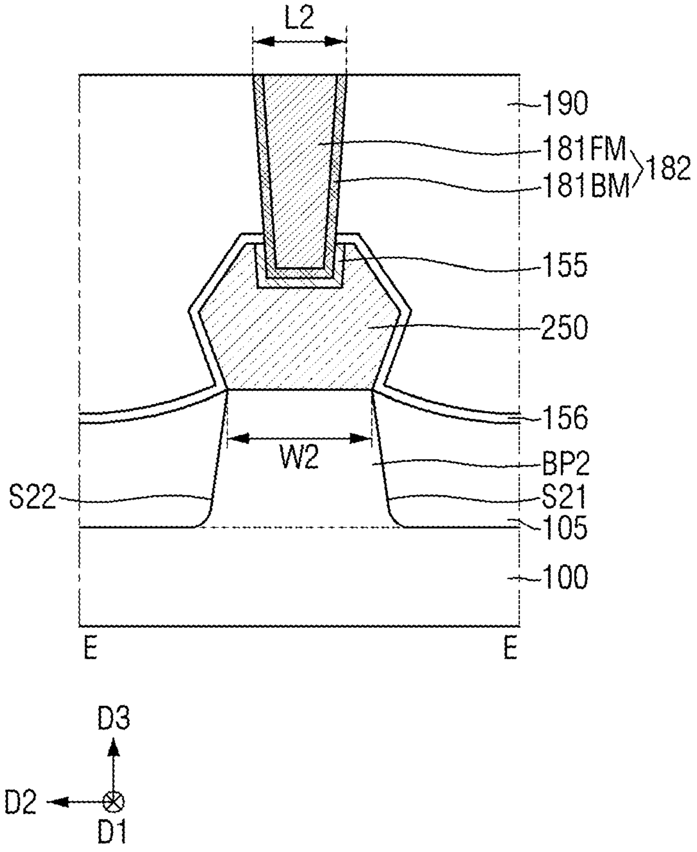
FIG. 8 is a cross-sectional view taken along line E-E of FIG. 1.

FIG. 1 is an exemplary layout view for describing a semiconductor device according to some exemplary embodiments. FIGS. 2 and 3 are enlarged views of region R of FIG. 1. FIG. 4 is a cross-sectional view taken along line A-A of FIG. 1. FIG. 5 is a cross-sectional view taken along line B-B of FIG. 1. FIG. 6 is a cross-sectional view taken along line C-C of FIG. 1. FIG. 7 is a cross-sectional view taken along line D-D of FIG. 1. FIG. 8 is a cross-sectional view taken along line E-E of FIG. 1.

Referring to FIGS. 1 to 8, a semiconductor device according to some exemplary embodiments may include a first active pattern 110, a second active pattern 210, a third active pattern 310, a fourth active pattern 410, a first element separation structure 165, a second element separation structure 265, a third element separation structure 365, a first gate electrode 120, and a plurality of second gate electrodes 221, 222, 223, and 224 on a substrate 100.

The substrate 100 may include a first active region RX1, a second active region RX2, and a field region FX. The field region FX may be disposed between the first active region RX1 and the second active region RX2. The field region FX may form a boundary with the first active region RX1 and the second active region RX2. The first active region RX1 and the second active region RX2 may be spaced apart from each other. The first active region RX1 and the second active region RX2 may be separated by the field region FX. The field region FX may be defined by a deep trench.

In other words, an element separation layer may be disposed around each of the first active region RX1 and the second active region RX2 that are spaced apart from each other. In this case, a portion of the element separation layer between the first active region RX1 and the second active region RX2 may be the field region FX. For example, a portion in which a channel region of a transistor, which may be an example of the semiconductor device, is formed may be an active region, and a portion dividing the channel region of the transistor formed in the active region may be a field region. In another example, the active region may be a portion in which an active pattern or a nanosheet used as the channel region of the transistor is formed, and the field region may be a region in which the active pattern or the nanosheet used as the channel region is not formed.

In some exemplary embodiments, one of the first active region RX1 and the second active region RX2 may be a PMOS formation region and the other thereof may be an NMOS formation region. In another exemplary embodiment, both the first active region RX1 and the second active region RX2 may be a PMOS formation region. In yet another exemplary embodiment, both the first active region RX1 and the second active region RX2 may be an NMOS formation region.

For example, the substrate 100 may be bulk silicon or silicon-on-insulator (SOI). In another example, the substrate 100 may be a silicon substrate, and may further include another material, e.g., silicon germanium, silicon germanium on insulator (SGOI), indium antimonide, lead tellurium compound, indium arsenide, indium phosphide, gallium arsenide, or gallium antimonide.

The first active pattern 110 and the second active pattern 210 may be disposed on the substrate 100. The first active pattern 110 and the second active pattern 210 may be formed in the first active region RX1 of the substrate 100. The first active pattern 110 and the second active pattern 210 may extend along a first direction D1. The first active pattern 110 and the second active pattern 210 may be spaced apart from each other in the first direction D1.

Here, the first direction D1 may intersect a second direction D2 and a third direction D3. In addition, the second direction D2 may intersect the third direction D3. The third direction D3 may be a direction perpendicular to a top surface of the substrate 100, and the first and second directions D1 and D2 may be parallel to the top surface of the substrate 100.

The third active pattern 310 and the fourth active pattern 410 may be disposed on the substrate 100. The third active pattern 310 and the fourth active pattern 410 may be formed in the second active region RX2. The third active pattern 310 and the fourth active pattern 410 may extend along the first direction D1. The third active pattern 310 and the fourth active pattern 410 may be spaced apart from each other in the first direction D1. The third active pattern 310 may be spaced apart from the first active pattern 110 in the second direction D2, and the fourth active pattern 410 may be spaced apart from the second active pattern 210 in the second direction D2. The first active region RX1 and the second active region RX2 may be divided by the first active pattern 110 and the third active pattern 310, and the second active pattern 210 and the fourth active pattern 410.

Each of the first to fourth active patterns 110, 210, 310, and 410 may be a multi-channel active pattern. The first active pattern 110 may include a first lower pattern BP1 and a plurality of first sheet patterns NS1, and the second active pattern 210 may include a second lower pattern BP2 and a plurality of second sheet patterns NS2. The third active pattern 310 may include a lower pattern and a plurality of sheet patterns similarly to the first active pattern 110, and the fourth active pattern 410 may include a lower pattern and a plurality of sheet patterns similarly to the second active pattern 210.

The first lower pattern BP1 may protrude from the substrate 100. The first lower pattern BP1 may extend, e.g., lengthwise, to be long in the first direction D1. The plurality of first sheet patterns NS1 may be disposed on the first lower pattern BP1. The plurality of first sheet patterns NS1 may be spaced apart from the first lower pattern BP1 in the third direction D3. The respective first sheet patterns NS1 may be spaced apart from each other in the third direction D3.

The second lower pattern BP2 may protrude from the substrate 100. The second lower pattern BP2 may extend, e.g., lengthwise, to be long in the first direction D1. The plurality of second sheet patterns NS2 may be disposed on the second lower pattern BP2. The plurality of second sheet patterns NS2 may be spaced apart from the second lower pattern BP2 in the third direction D3. The respective second sheet patterns NS2 may be spaced apart from each other in the third direction D3.

For example, each of the first sheet pattern NS1 and the second sheet pattern NS2 may be a nanosheet or a nanowire. Although three first sheet patterns NS1 and three second sheet patterns NS2 are illustrated, respectively, this is merely for convenience of explanation and the present disclosure may include any suitable number of first and second sheet patterns.

In the semiconductor device according to some exemplary embodiments, a width of the first active pattern 110 between the first element separation structure 165 and the second element separation structure 265 in the second direction D2 may be greater than a width of the second active pattern 210 between the second element separation structure 265 and the third element separation structure 365 in the second direction D2, and a width of the third active pattern 310 between the first element separation structure 165 and the second element separation structure 265 in the second direction D2 may be greater than a width of the fourth active pattern 410 between the second element separation structure 265 and the third element separation structure 365 in the second direction D2.

A width W1 of the first active pattern 110 in the second direction D2 may be different from a width W2 of the second active pattern 210 in the second direction D2. For example, the width W1 of the first active pattern 110 in the second direction D2 may be greater than the width W2 of the second active pattern 210 in the second direction D2. For example, the width W1 of the first active pattern 110 in the second direction D2 may be a width of a top surface of the first lower pattern BP1 in the second direction D2, and the width W2 of the second active pattern 210 in the second direction D2 may be a width of a top surface of the second lower pattern BP2 in the second direction D2.

In the semiconductor device according to some exemplary embodiments, the width W1 of the first active pattern 110 in the second direction D2 may be constant as a distance from the second element separation structure 265 increases, and the width W2 of the second active pattern 210 in the second direction D2 may be constant as the distance from the second element separation structure 265 increases.

A width W3 of the third active pattern 310 in the second direction D2 may be different from a width W4 of the fourth active pattern 410 in the second direction D2. For example, the width W3 of the third active pattern 310 in the second direction D2 may be greater than the width W4 of the fourth active pattern 410 in the second direction D2. For example, the width W3 of the third active pattern 310 in the second direction D2 may be a width of a top surface of a third lower pattern in the second direction D2, and the width W4 of the fourth active pattern 410 in the second direction D2 may be a width of a top surface of a fourth lower pattern in the second direction D2.

In the semiconductor device according to some exemplary embodiments, the width W3 of the third active pattern 310 in the second direction D2 may be constant as a distance from the second element separation structure 265 increases, and the width W4 of the fourth active pattern 410 in the second direction D2 may be constant as the distance from the second element separation structure 265 increases.

The entirety of the second active pattern 210 may overlap the first active pattern 110 in the first direction D1. In a plan view, as illustrated in FIG. 1, the first active pattern 110 may have a shape including a portion protruding beyond the second active pattern 210 in the second direction D2 and a portion protruding beyond the second active pattern 210 in a direction opposite to the second direction D2, e.g., a portion the first active pattern 110 may extend beyond each of opposite edges of the second active pattern 210 that are spaced apart from each other in the second direction D2. The plan view may be configured in the first direction D1 and the second direction D2.

In detail, the first active pattern 110 may include a first-first sidewall S11 and a first-second sidewall S12 opposite to each other in the second direction D2. The second active pattern 210 may include a second-first sidewall S21 and a second-second sidewall S22 opposite to each other in the second direction D2. For example, the first-first sidewall S11 and the second-first sidewall S21 may be disposed on different planes, e.g., the first-first sidewall S11 and the second-first sidewall S21 may be offset from each other in the second direction D2 (in top view). For example, the first-second sidewall S12 and the second-second sidewall S22 may be disposed on different planes, e.g., the first-second sidewall S12 and the second-second sidewall S22 may be offset from each other in the second direction D2 (in top view). For example, as illustrated in FIG. 1, the first-first sidewall S11 may be disposed lower than the second-first sidewall S21 in the second direction D2, e.g., a distance between the first-first sidewall S11 and the second active region RX2 in the second direction D2 may be smaller than a distance between the second-first sidewall S21 and the second active region RX2 in the second direction D2. For example, as further illustrated in FIG. 1, the first-second sidewall S12 may be disposed higher than the second-second sidewall S22 in the second direction D2, e.g., a distance between the first-second sidewall S12 and the second active region RX2 in the second direction D2 may be larger than a distance between the second-second sidewall S22 and the second active region RX2 in the second direction D2.

The first-first sidewall S11 and the first-second sidewall S12 of the first active pattern 110 may be sidewalls of the first lower pattern BP1. The first lower pattern BP1 may include the first-first sidewall S11 and the first-second sidewall S12 opposite to each other in the second direction D2. The second-first sidewall S21 and the second-second sidewall S22 of the second active pattern 210 may be sidewalls of the second lower pattern BP2. The second lower pattern BP2 may include the second-first sidewall S21 and the second-second sidewall S22 opposite to each other in the second direction D2.

The entirety of the fourth active pattern 410 may overlap the third active pattern 310 in the first direction D1. In a plan view, as illustrated in FIG. 1, the third active pattern 310 may have a shape including a portion protruding beyond the fourth active pattern 410 in the second direction D2 and a portion protruding beyond the fourth active pattern 410 in a direction opposite to the second direction D2, e.g., a portion the third active pattern 310 may extend beyond each of opposite edges of the fourth active pattern 410 that are spaced apart from each other in the second direction D2.

The third active pattern 310 may include a third-first sidewall S31 and a third-second sidewall S32 opposite to each other in the second direction D2. The third-second sidewall S32 may face the first-first sidewall S11 in the second direction D2. The fourth active pattern 410 may include a fourth-first sidewall S41 and a fourth-second sidewall S42 opposite to each other in the second direction D2. The fourth-second sidewall S42 may face the second-first sidewall S21 in the second direction D2. The third-first sidewall S31 and the fourth-first sidewall S41 may be disposed on different planes, e.g., third-first sidewall S31 and the fourth-first sidewall S41 may be offset from each other in the second direction D2 (in top view). The third-second sidewall S32 and the fourth-second sidewall S42 may be disposed on different planes, e.g., third-second sidewall S32 and the fourth-second sidewall S42 may be offset from each other in the second direction D2 (in top view). For example, as viewed in a top view (FIG. 1), the third-first sidewall S31 may be disposed lower (e.g., closer to the second active region RX2) than the fourth-first sidewall S41 in the second direction D2, and the third-second sidewall S32 may be disposed higher (e.g., farther from the second active region RX2) than the fourth-second sidewall S42 in the second direction D2.

The third-first sidewall S31 and the third-second sidewall S32 of the third active pattern 310 may be sidewalls of the third lower pattern. The third lower pattern may include the third-first sidewall S31 and the third-second sidewall S32 opposite to each other in the second direction D2. The fourth-first sidewall S41 and the fourth-second sidewall S42 of the fourth active pattern 410 may be sidewalls of the fourth lower pattern. The fourth lower pattern may include the fourth-first sidewall S41 and the fourth-second sidewall S42 opposite to each other in the second direction D2.

In other words, referring to FIG. 1, a distance S1 between the first active pattern 110 and the third active pattern 310 between the first element separation structure 165 and the second element separation structure 265 may be different from a distance S2 between the second active pattern 210 and the fourth active pattern 410 between the second element separation structure 265 and the third element separation structure 365. The distance S1 between the first active pattern 110 and the third active pattern 310 in the second direction D2 may be smaller than the distance S2 between the second active pattern 210 and the fourth active pattern 410 in the second direction. Here, the distance S1 and the distance S2 may be distances measured in the second direction D2 at the same height from the substrate 100 in the third direction D3.

Since descriptions of the third active pattern 310 and the fourth active pattern 410 may be substantially the same as those of the first active pattern 110 and the second active pattern 210, the first active pattern 110 and the second active pattern 210 will be mainly described in the following description.

Referring to FIG. 2, in the semiconductor device according to some exemplary embodiments, as viewed in a plan view, the first-first sidewall S11 of the first active pattern 110 and the second-first sidewall S21 of the second active pattern 210 may be spaced apart, e.g., offset, from each other by a first distance P1 in the second direction D2, and the first-second sidewall S12 of the first active pattern 110 and the second-second sidewall S22 of the second active pattern 210 may be spaced apart, e.g., offset, from each other by a second distance P2 in the second direction D2. The first distance P1 and the second distance P2 may be substantially the same.

Referring to FIG. 3, in the semiconductor device according to some exemplary embodiments, the first distance P1 and the second distance P2 may be different from each other. For example, as illustrated in FIG. 3, the first distance P1 may be greater than the second distance P2. In another example, the second distance P2 may be greater than the first distance P1.

Referring back to FIGS. 1 to 8, each of the first lower pattern BP1 and the second lower pattern BP2 may be formed by etching a portion of the substrate 100, and may include an epitaxial layer grown from the substrate 100. For example, each of the first lower pattern BP1 and the second lower pattern BP2 may include silicon or germanium, which is an elemental semiconductor material. In addition, each of the first lower pattern BP1 and the second lower pattern BP2 may include a compound semiconductor, e.g., a group IV-IV compound semiconductor or a group III-V compound semiconductor.

The group IV-IV compound semiconductor may be, e.g., a binary compound or a ternary compound including at least two or more of carbon (C), silicon (Si), germanium (Ge), and tin (Sn), or a compound obtained by doping carbon (C), silicon (Si), germanium (Ge), and tin (Sn) with a group IV element. The III-V compound semiconductor may be, e.g., one of a binary compound, a ternary compound, or a quaternary compound formed by combining at least one of aluminum (Al), gallium (Ga), and indium (In), which are group III elements, and one of phosphorus (P), arsenic (As), and antimony (Sb), which are group V elements.

Each of the first sheet pattern NS1 and the second sheet pattern NS2 may include one of silicon or germanium, which is an elemental semiconductor material, a group IV-IV compound semiconductor, or a group III-V compound semiconductor. Each of the first sheet patterns NS1 may also include the same material as the first lower pattern BP1 or a material different from that of the first lower pattern BP1. Each of the second sheet patterns NS2 may also include the same material as the second lower pattern BP2 or a material different from that of the second lower pattern BP2.

Although it is illustrated that the widths of the first sheet patterns NS1 stacked in the third direction D3 in the second direction D2 are the same, and the widths of the second sheet patterns NS2 stacked in the third direction D3 in the second direction D2 are the same, this is merely for convenience of explanation and the present disclosure is not limited thereto. For example, the width of the first sheet pattern NS1 stacked in the third direction D3 in the second direction D2 may decrease as a distance from the first lower pattern BP1 increases, and the width of the second sheet patterns NS2 stacked in the third direction D3 in the second direction D2 may decrease as the distance from the second lower pattern BP2 increases.

A field insulating layer 105 may be formed on the substrate 100. The field insulating layer 105 may be formed across the first active region RX1, the second active region RX2, and the field region FX. The field insulating layer 105 may fill a deep trench.

The field insulating layer 105 may be disposed on the sidewall of each of the first lower pattern BP1 and the second lower pattern BP2. The field insulating layer 105 may surround a portion of the sidewall of each of the first lower pattern BP1 and the second lower pattern BP2. Each of the first lower pattern BP1 and the second lower pattern BP2 may protrude above a top surface of the field insulating layer 105 in the third direction D3. A top surface of each of the first lower pattern BP1 and the second lower pattern BP2 may protrude above the top surface of the field insulating layer 105 in the third direction D3. The field insulating layer 105 may include, e.g., an oxide layer, a nitride layer, an oxynitride layer, or a combination thereof.

The first element separation structure 165, the first gate electrode 120, the second element separation structure 265, the plurality of second gate electrodes 221, 222, 223, and 224, and the third element separation structure 365 may be sequentially arranged to be spaced apart from each other along the first direction D1. The first element separation structure 165, the first gate electrode 120, the second element separation structure 265, the plurality of second gate electrodes 221, 222, 223, and 224, and the third element separation structure 365 may be arranged to be spaced apart from each other along the first direction D1 at a first pitch. The plurality of second gate electrodes 221, 222, 223, and 224 may be arranged to be spaced apart from each other along the first direction D1 at the first pitch. A pitch between the first element separation structure 165 and the first gate electrode 120, a pitch between the first gate electrode 120 and the second element separation structure 265, a pitch between the second element separation structure 265 and the second gate electrode 221, a pitch between two adjacent second gate electrodes among the second gate electrodes 221, 222, 223, and 224, and a pitch between the second gate electrode 224 and the third element separation structure 365 may be the first pitch.

Each of the first to third element separation structures 165, 265, and 365 may be disposed, e.g., continuously, across the first active region RX1 and the second active region RX2. Each of the first to third element separation structures 165, 265, and 365 may extend, e.g., lengthwise, in the second direction D2.

The first active pattern 110 and the third active pattern 310 may be disposed between the first element separation structure 165 and the second element separation structure 265, e.g., opposite ends of each the first and third active patterns 110 and 310 may contact the first and second element separation structures 165 and 265, respectively. The second active pattern 210 and the fourth active pattern 410 may be disposed between the second element separation structure 265 and the third element separation structure 365, e.g., opposite ends of each the second and fourth active patterns 210 and 410 may contact the second and third element separation structures 265 and 365, respectively.

In detail, the first element separation structure 165 may be in contact with an end of the first active pattern 110 and an end of the third active pattern 310. The first element separation structure 165 may be in contact with an end sidewall of the first active pattern 110 and an end sidewall of the third active pattern 310. The second element separation structure 265 may be in contact with an end of the first active pattern 110 and an end of the second active pattern 210. The second element separation structure 265 may be in contact with an end of the third active pattern 310 and an end of the fourth active pattern 410. The second element separation structure 265 may be in contact with an end sidewall of the first active pattern 110 and an end sidewall of the second active pattern 210 facing each other in the first direction D1. The second element separation structure 265 may be in contact with an end sidewall of the third active pattern 310 and an end sidewall of the fourth active pattern 410 facing each other in the first direction D1. The third element separation structure 365 may be in contact with an end of the second active pattern 210 and an end of the fourth active pattern 410. The third element separation structure 365 may be in contact with an end sidewall of the second active pattern 210 and an end sidewall of the fourth active pattern 410. The second element separation structure 265 may separate the first active pattern 110 and the second active pattern 210 from each other, and may separate the third active pattern 310 and the fourth active pattern 410 from each other.

Since the descriptions of the first element separation structure 165 and the third element separation structure 365 may be substantially the same as that of the second element separation structure 265, the second element separation structure 265 will be mainly described in the following description.

The second element separation structure 265 may separate the first lower pattern BP1 and the second lower pattern BP2 from each other. The second element separation structure 265 may be disposed between the first lower pattern BP1 and the second lower pattern BP2. The second element separation structure 265 may be in, e.g., direct, contact with each of the first lower pattern BP1 and the second lower pattern BP2.

In the semiconductor device according to some exemplary embodiments, a separation structure spacer 265SP may extend along a portion of a sidewall of the second element separation structure 265. For example, as illustrated in FIG. 4, the separation structure spacer 265SP may extend along a portion of opposite sidewalls, e.g., both sidewalls, of the second element separation structure 265 in the first direction D1. The separation structure spacer 265SP may include the same material as a gate spacer 140. In another example, the separation structure spacer 265SP may not be disposed on the sidewall of the second element separation structure 265.

For example, as illustrated in FIG. 4, a sheet pattern NS_P may remain on a portion of the sidewall of the second element separation structure 265. In another example, the sheet pattern NS_P may not be disposed on the sidewall of the second element separation structure 265.

Each of the first to third element separation structures 165, 265, and 365 may include, e.g., at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and a combination thereof. Each of the first to third element separation structures 165, 265, and 365 is illustrated as a single layer, but is not limited thereto, e.g., may include multiple layers.

The first gate electrode 120 may be disposed between the first element separation structure 165 and the second element separation structure 265. The plurality of second gate electrodes 221, 222, 223, and 224 may be disposed between the second element separation structure 265 and the third element separation structure 365. That is, one first gate electrode 120 may be disposed between the first element separation structure 165 and the second element separation structure 265, and the plurality of second gate electrodes 221, 222, 223, and 224 may be disposed between the second element separation structure 265 and the third element separation structure 365. Although four second gate electrodes 221, 222, 224, and 224 are illustrated, it is merely for convenience of explanation and any suitable number of second gate electrodes may be implemented.

The first gate electrode 120 and the plurality of second gate electrodes 221, 222, 223, and 224 may each extend, e.g., lengthwise, in the second direction D2. The first gate electrode 120 and the plurality of second gate electrodes 221, 222, 223, and 224 may be disposed, e.g., continuously, on the first active region RX1 and the second active region RX2, respectively.

The first gate electrode 120 may be disposed on the first active pattern 110 and the third active pattern 310. The first gate electrode 120 may intersect the first active pattern 110 and the third active pattern 310. The first gate electrode 120 may surround the first sheet pattern NS1.

Each of the second gate electrodes 221, 222, 223, and 224 may be disposed on the second active pattern 210 and the fourth active pattern 410. Each of the second gate electrodes 221, 222, 223, and 224 may intersect the second active pattern 210 and the fourth active pattern 410. Each of the second gate electrodes 221, 222, 223, and 224 may surround the second sheet pattern NS2.

Each of the first gate electrode 120 and the plurality of second gate electrodes 221, 222, 223, and 224 may include, e.g., at least one of a metal, a metal alloy, conductive metal nitride, conductive metal carbide, conductive metal carbonitride, metal silicide, a doped semiconductor material, conductive metal oxide, and conductive metal oxynitride. The first gate electrode 120 may include, e.g., at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof, but is not limited thereto. The conductive metal oxide and the conductive metal oxynitride may include, e.g., an oxidized form of the above-described material.

The gate insulating layer 130 may extend along the top surface of the field insulating layer 105 and the top surface of the first lower pattern BP1. The gate insulating layer 130 may surround the first sheet pattern NS1. The gate insulating layer 130 may be disposed along a circumference of the first sheet pattern NS1. The gate insulating layer 130 may be disposed between the first gate electrode 120 and the first sheet pattern NS1. The gate insulating layer 130 may extend along the top surface of the field insulating layer 105 and the top surface of the second lower pattern BP2. The gate insulating layer 130 may surround the second sheet pattern NS2. The gate insulating layer 130 may be disposed along a circumference of the second sheet pattern NS2. The gate insulating layer 130 may be disposed between each of the second gate electrodes 221, 222, 223, and 224 and the second sheet pattern NS2.

The gate insulating layer 130 may include, e.g., at least one of silicon oxide, silicon-germanium oxide, germanium oxide, silicon oxynitride, silicon nitride, or a high-k material having a dielectric constant greater than that of the silicon oxide. The high-k material may include, e.g., one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although the gate insulating layer 130 is illustrated as a single layer, it is merely for convenience of explanation and the present disclosure is not limited thereto. The gate insulating layer 130 may include a plurality of layers. For example, the gate insulating layer 130 may include an interfacial layer and a high dielectric constant insulating layer.

The gate spacer 140 may be disposed on a sidewall of the first gate electrode 120. The gate spacer 140 may not be disposed between the first lower pattern BP1 and the first sheet pattern NS1 and between the first sheet patterns NS1 adjacent to each other in the third direction D3. The gate spacer 140 may be disposed on a sidewall of the second gate electrodes 221, 222, 223, and 224. The gate spacer 140 may not be disposed between the second lower pattern BP2 and the second sheet pattern NS2 and between the second sheet patterns NS2 adjacent to each other in the third direction D3.

The gate spacer 140 may include, e.g., at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and a combination thereof. Although the gate spacer 140 is illustrated as a single layer, it is merely for convenience of explanation and the present disclosure is not limited thereto, e.g., the gate spacer 140 may include a plurality of layers.

A gate capping pattern 145 may be disposed on the first gate electrode 120 and each of the second gate electrodes 221, 222, 223, and 224. The gate capping pattern 145 may be disposed on the gate spacer 140. A top surface of the gate capping pattern 145 may be on the same plane as a top surface of an interlayer insulating layer 190. Unlike illustrated, the gate capping pattern 145 may be disposed between the gate spacers 140.

The gate capping pattern 145 may include, e.g., at least one of silicon nitride (SiN), silicon oxynitride (SiON), silicon oxide ($SiO_2$), silicon carbonitride (SiCN), silicon oxycarbonitride (SiOCN), and a combination thereof.

A first source/drain pattern 150 may be disposed on the first active pattern 110. The first source/drain pattern 150 may be disposed on the first lower pattern BP1. The first source/drain pattern 150 may be connected to the plurality of first sheet patterns NS1. The first source/drain pattern 150 may be in contact with the plurality of first sheet patterns NS1.

The first source/drain pattern 150 may be disposed on a side surface of the first gate electrode 120. The first source/drain pattern 150 may be disposed between the first element separation structure 165 and the second element separation structure 265. For example, the first source/drain pattern 150 may be disposed on both sides of the first gate electrode 120. As still another example, the first source/drain pattern 150 may be disposed on one side of the first gate electrode 120 and may not be disposed on the other side of the first gate electrode 120.

A second source/drain pattern 250 may be disposed on the second active pattern 210. The second source/drain pattern 250 may be disposed on the second lower pattern BP2. The second source/drain pattern 250 may be connected to the plurality of second sheet patterns NS2. The second source/drain pattern 250 may be in contact with the plurality of second sheet patterns NS2.

The second source/drain pattern 250 may be disposed on a side surface of each of the second gate electrodes 221, 222, 223, and 224. The second source/drain pattern 250 may be disposed between the second element separation structure 265 and the third element separation structure 365. For example, the second source/drain pattern 250 may be disposed on both sides of each of the second gate electrodes 221, 222, 223, and 224. As still another example, the second source/drain pattern 250 may be disposed on one side of each of the second gate electrodes 221, 222, 223, and 224 and may not be disposed on the other side of each of the second gate electrodes 221, 222, 223, and 224.

The first source/drain pattern 150 may be included in a source/drain of a transistor using the first sheet pattern NS1 as a channel region, and the second source/drain pattern 250 may be included in a source/drain of a transistor using the second sheet pattern NS2 as a channel region. Each of the first source/drain pattern 150 and the second source/drain pattern 250 may include an epitaxial pattern. The first source/drain pattern 150 and the second source/drain pattern 250 may include a semiconductor material.

The first source/drain pattern 150 and the second source/drain pattern 250 may include, e.g., silicon or germanium, which is an elemental semiconductor material. In addition, the first source/drain pattern 150 and the second source/drain pattern 250 may include, e.g., a binary compound or a ternary compound including at least two or more of carbon (C), silicon (Si), germanium (Ge), and tin (Sn), or a compound obtained by doping carbon (C), silicon (Si), germanium (Ge), and tin (Sn) with a group IV element. For example, the first source/drain pattern 150 and the second source/drain pattern 250 may include silicon, silicon-germanium, silicon carbide, or the like. The first source/drain pattern 150 and the second source/drain pattern 250 may include impurities doped into a semiconductor material.

Although the first source/drain pattern 150 and the second source/drain pattern 250 are illustrated as a single layer, this is merely for convenience of explanation and the present disclosure is not limited thereto, e.g., the first and second source/drain patterns 150 and 250 may include multiple layers. For example, the first source/drain pattern 150 and the second source/drain pattern 250 may have any suitable shape, e.g., a hexagon.

An etch stop layer 156 may be disposed on sidewalls of the first gate electrode 120 and the plurality of second gate electrodes 221, 222, 223, and 224 on the first and second source/drain patterns 150 and 250. The etch stop layer 156 may include a material having an etch selectivity with respect to the interlayer insulating layer 190. The etch stop layer 156 may include, e.g., at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), and a combination thereof.

The interlayer insulating layer 190 may be disposed on the etch stop layer 156. For example, the interlayer insulating layer 190 may not cover the top surface of the gate capping pattern 145. For example, a top surface of the interlayer insulating layer 190 may be on the same plane as the top surface of the gate capping pattern 145. The top surface of the interlayer insulating layer 190 may be on the same plane as the top surfaces of the first to third element separation structures 165, 265, and 365.

The interlayer insulating layer 190 may include, e.g., at least one of silicon oxide, silicon nitride, silicon oxynitride, and a low-k material. The low-k material may include, e.g., fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazene (TOSZ), fluoride silicate glass (FSG), polyimide nanofoams, polypropylene oxide, carbon doped silicon oxide (CDO), organo silicate glass (OSG), SiLK, amorphous fluorinated carbon, silica aerogels, silica xerogels, mesoporous silica, or a combination thereof.

Each of the first to fourth source/drain contacts 181, 182, 183, and 184 may be disposed on each of the first to fourth active patterns 110, 210, 310, and 410. The first source/drain contact 181 may penetrate through the etch stop layer 156 and be connected to the first source/drain pattern 150 on the first active pattern 110. The second source/drain contact 182 may penetrate through the etch stop layer 156 and be connected to the second source/drain pattern 250 on the second active pattern 210. The third source/drain contact 183 may penetrate through the etch stop layer 156 and be connected to a source/drain pattern on the third active pattern 310. The fourth source/drain contact 184 may penetrate through the etch stop layer 156 and be connected to a source/drain pattern on the fourth active pattern 410.

Since descriptions of the third source/drain contact 183 and the fourth source/drain contact 184 may be substantially the same as those of the first source/drain contact 181 and the second source/drain contact 182, the first source/drain contact 181 and the second source/drain contact 182 will be mainly described in the following description.

Referring to FIGS. 2 and 3, in the semiconductor device according to some exemplary embodiments, a length L1 of the first source/drain contact 181 in the second direction D2 may be substantially the same as a length L2 of the second source/drain contact 182 in the second direction D2. For example, a length of the first source/drain contact 181 in the first direction D1 may be substantially the same as a length of the second source/drain contact 182 in the first direction D1.

Referring back to FIGS. 1 to 8, each of the first to fourth source/drain contacts 181, 182, 183, and 184 may include a source/drain barrier layer 181BM and a source/drain filling layer 181FM. The source/drain barrier layer 181BM may include, e.g., at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. In the semiconductor device according to some exemplary embodiments, the 2D material may be a metallic material and/or a semiconductor material. The 2D material may include a two-dimensional allotrope or a two-dimensional compound, and may include, e.g., at least one of graphene, molybdenum disulfide ($MoS_2$), molybdenum diselenide ($MoSe_2$), tungsten diselenide ($WSe_2$), and tungsten disulfide ($WS_2$). The source/drain filling layer 181FM may include, e.g., at least one of aluminum (Al), tungsten (W), cobalt (Co), ruthenium (Ru), copper (Cu), silver (Ag), gold (Au), manganese (Mn), and molybdenum (Mo).

A silicide layer 155 may be formed between the first source/drain pattern 150 and the first source/drain contact 181, between the second source/drain pattern 250 and the second source/drain contact 182, between the source/drain pattern of the third active pattern 310 and the third source/drain contact 183, and between the source/drain pattern of the fourth active pattern 410 and the fourth source/drain contact 184. The silicide layer 155 may include, e.g., a metal silicide material.

In the process of forming the first to third element separation structures 165, 265, and 365, at least portions of the first source/drain pattern 150 and the second source/drain pattern 250 adjacent to each of the first to third element separation structures 165, 265, and 365 may be etched. As a result, volumes of the first source/drain pattern 150 and the second source/drain pattern 250 adjacent to each of the first to third element separation structures 165, 265, and 365 may be reduced, electrical characteristics of an element including the first source/drain pattern 150 and the second source/drain pattern 250 having the reduced volumes may change, and differences may occur between a model on which a design is based and hardware actually implemented in silicon. In particular, if the volumes of the first source/drain patterns 150 disposed on both sides of the first gate electrode 120 are reduced, a change in electrical characteristics of an element disposed between the first and second element separation structures 165 and 265 may be greater than a change in electrical characteristics of an element disposed between the second and third element separation structures 265 and 365, and a difference in electrical characteristics between the element disposed between the first and second element separation structures 165 and 265 and the element disposed between the second and third element separation structures 265 and 365 may occur.

In contrast, in the semiconductor device according to some exemplary embodiments, the width W1 of the first active pattern 110 and the width W3 of the third active pattern 310 (both of which are positioned between the first element separation structure 165 and the second element separation structure 265) may be greater than the width W2 of the second active pattern 210 and the width W4 of the fourth active pattern 410, respectively. Accordingly, electrical deterioration of the elements disposed between the first and second element separation structures 165 and 265 may be compensated for without changing the process of manufacturing the first to third element separation structures 165, 265, and 365. Accordingly, model hardware correlation (MHC) may be improved and the difference in electrical characteristics between the element disposed between the first and second element separation structures 165 and 265 and the element disposed between the second and third element separation structures 265 and 365 may be compensated.

Figure 9:
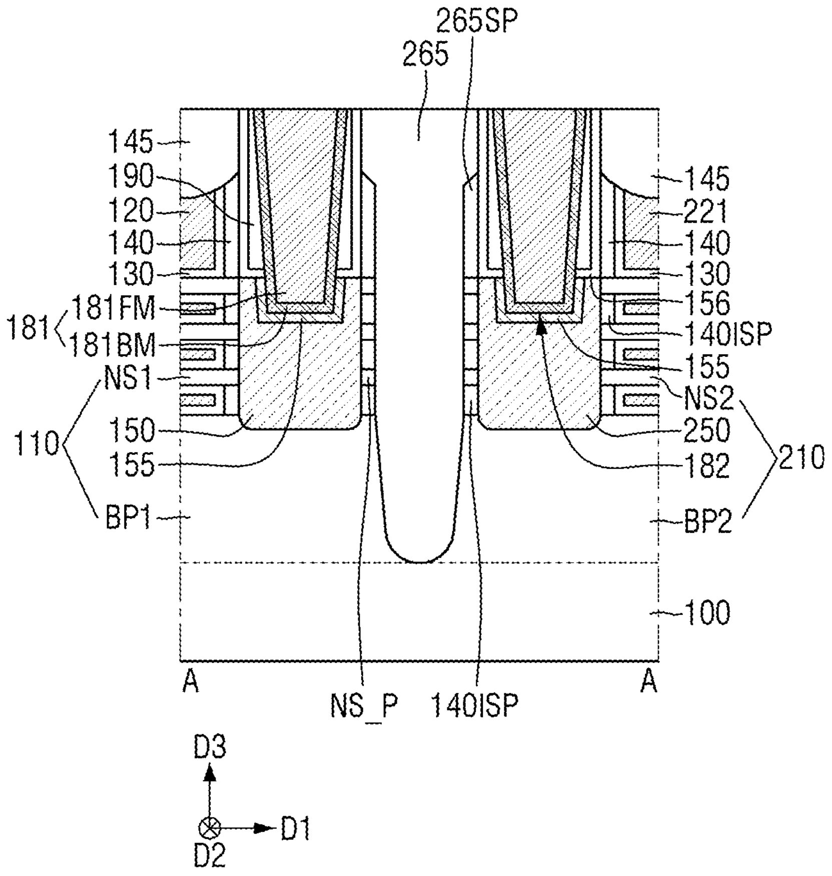
FIG. 9 is an exemplary cross-sectional view for describing a semiconductor device according to some exemplary embodiments.

FIG. 9 is an exemplary cross-sectional view for describing a semiconductor device according to some exemplary embodiments. For convenience of explanation, only points different from those described previously with reference to FIGS. 1 to 8 will be mainly described.

Referring to FIG. 9, a semiconductor device according to some exemplary embodiments may further include a plurality of inner spacers 140ISP.

The inner spacers 140ISP may be disposed between the first lower pattern BP1 and the first sheet pattern NS1 and between the first sheet patterns NS1 adjacent to each other in the third direction D3. The inner spacer 140ISP may be disposed between the first gate electrode 120 and the first source/drain pattern 150.

The inner spacers 140ISP may be disposed between the second lower pattern BP2 and the second sheet pattern NS2 and between the first sheet patterns NS2 adjacent to each other in the third direction D3. The inner spacers 140ISP may be disposed between each of the second gate electrodes 221, 222, 223, and 224 and the second source/drain pattern 250.

The inner spacer 140ISP may remain on a portion of the sidewall of the second element separation structure 265. The inner spacer 140ISP may remain between the sheet patterns NS_P adjacent to each other in the third direction D3. Alternatively, the inner spacer 140ISP may also not remain between the sheet patterns NS_P adjacent to each other in the third direction D3.

Figure 10:
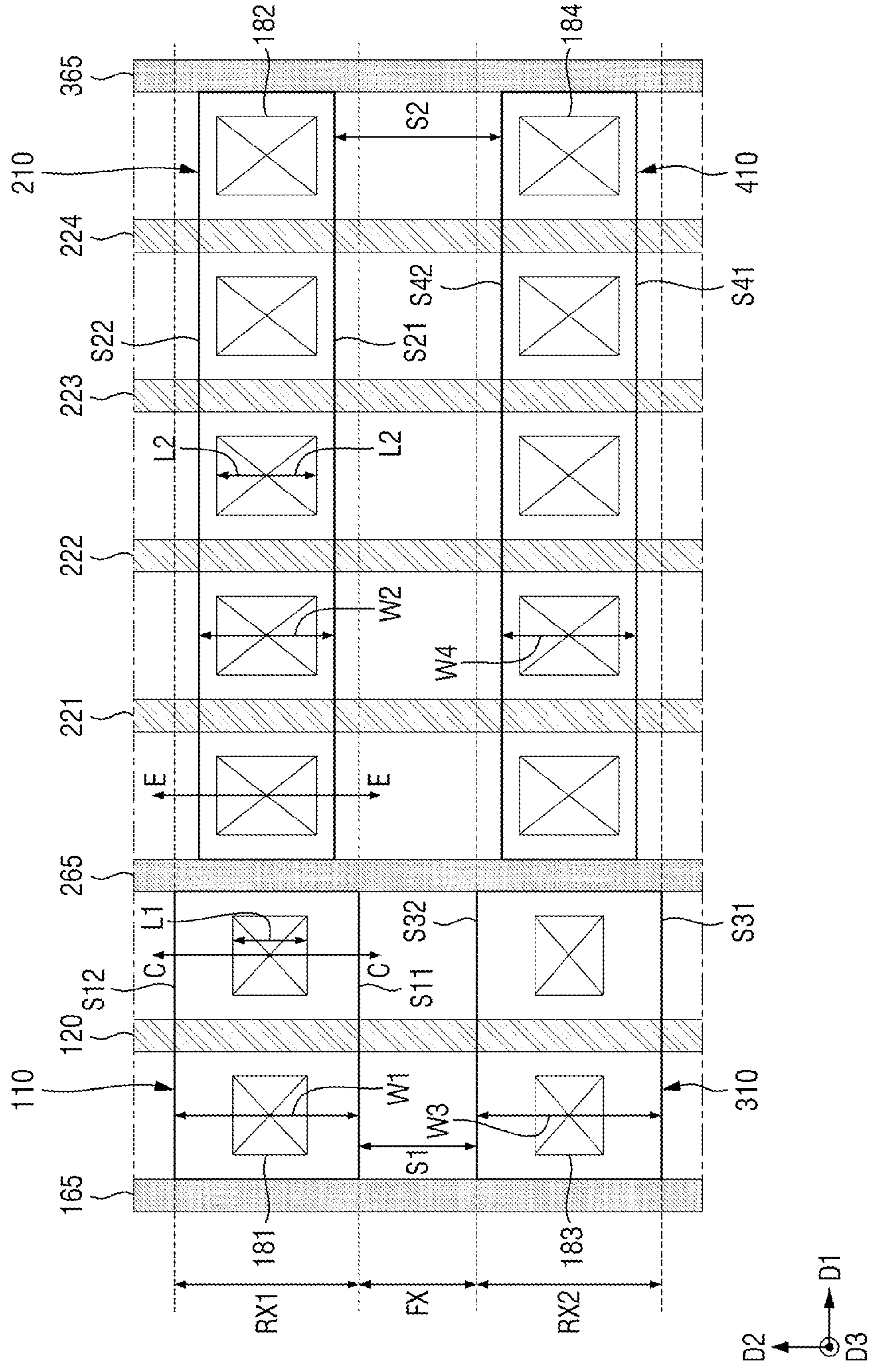
FIG. 10 is an exemplary layout view for describing a semiconductor device according to some exemplary embodiments.
Figure 11:
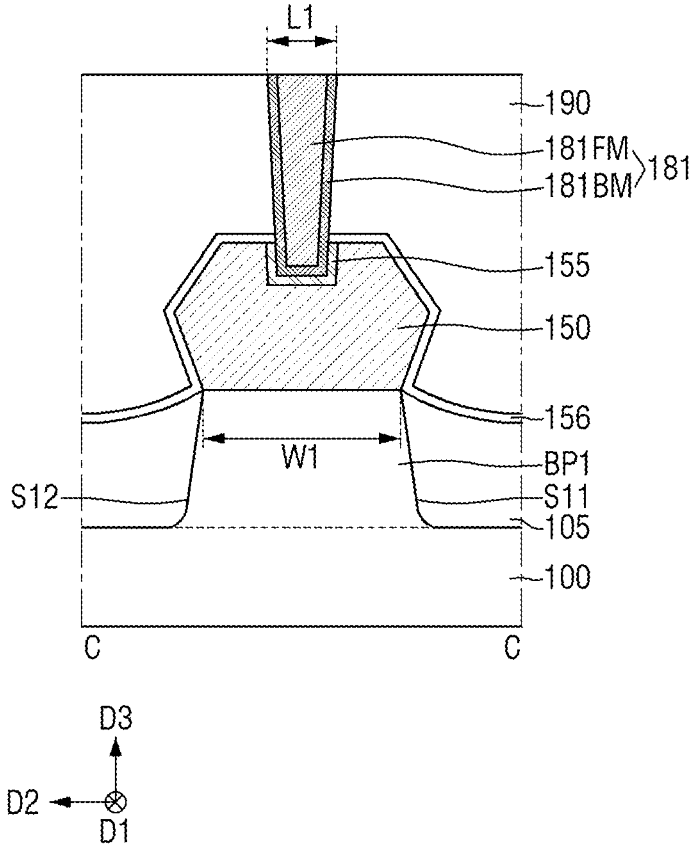
FIG. 11 is a cross-sectional view taken along line C-C of FIG. 10.
Figure 12:
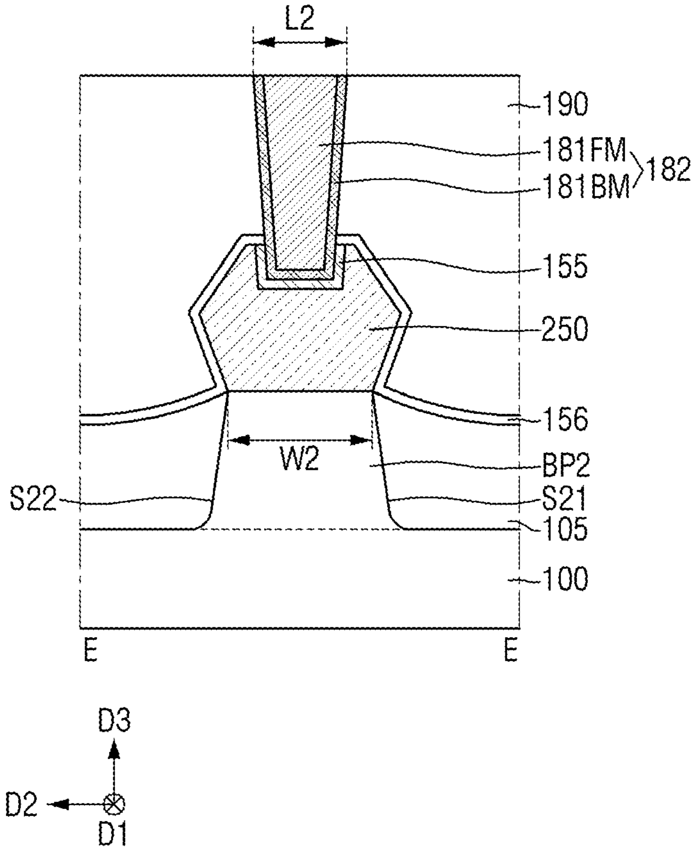
FIG. 12 is a cross-sectional view taken along line E-E of FIG. 10.

FIG. 10 is an exemplary layout view for describing a semiconductor device according to some exemplary embodiments. FIG. 11 is a cross-sectional view taken along line C-C of FIG. 10. FIG. 12 is a cross-sectional view taken along line E-E of FIG. 10. For convenience of explanation, only points different from those described previously with reference to FIGS. 1 to 8 will be mainly described.

Referring to FIGS. 10 to 12, in the semiconductor device according to some exemplary embodiments, the length L1 of the first source/drain contact 181 in the second direction D2 may be different from the length L2 of the second source/drain contact 182 in the second direction D2. The length L1 of the first source/drain contact 181 in the second direction D2 may be smaller than the length L2 of the second source/drain contact 182 in the second direction D2. A length of the third source/drain contact 183 in the second direction D2 may be smaller than a length of the fourth source/drain contact 184 in the second direction D2.

Due to the increase in the widths of the first active pattern 110 and the third active pattern 310 in the second direction D2, various undesirable parasitic capacitances between conductive regions adjacent to each other may increase. For example, due to an increase in the width W1 of the first active pattern 110 in the second direction D2, parasitic capacitance may increase between the first source/drain pattern 150 and the first gate electrode 120.

However, in the semiconductor device according to some exemplary embodiments, since the length L1 of the first source/drain contact 181 on the first active pattern 110 in the second direction D2 is smaller than the length L2 of the second source/drain contact 182 on the second active pattern 210 in the second direction D2, the undesirable parasitic capacitance between the conductive regions adjacent to each other may be reduced. For example, due to a decrease in the length L1 of the first source/drain contact 181 in the second direction D2, the parasitic capacitance between the first source/drain contact 181 and the first gate electrode 120 may be reduced.

Figure 13:
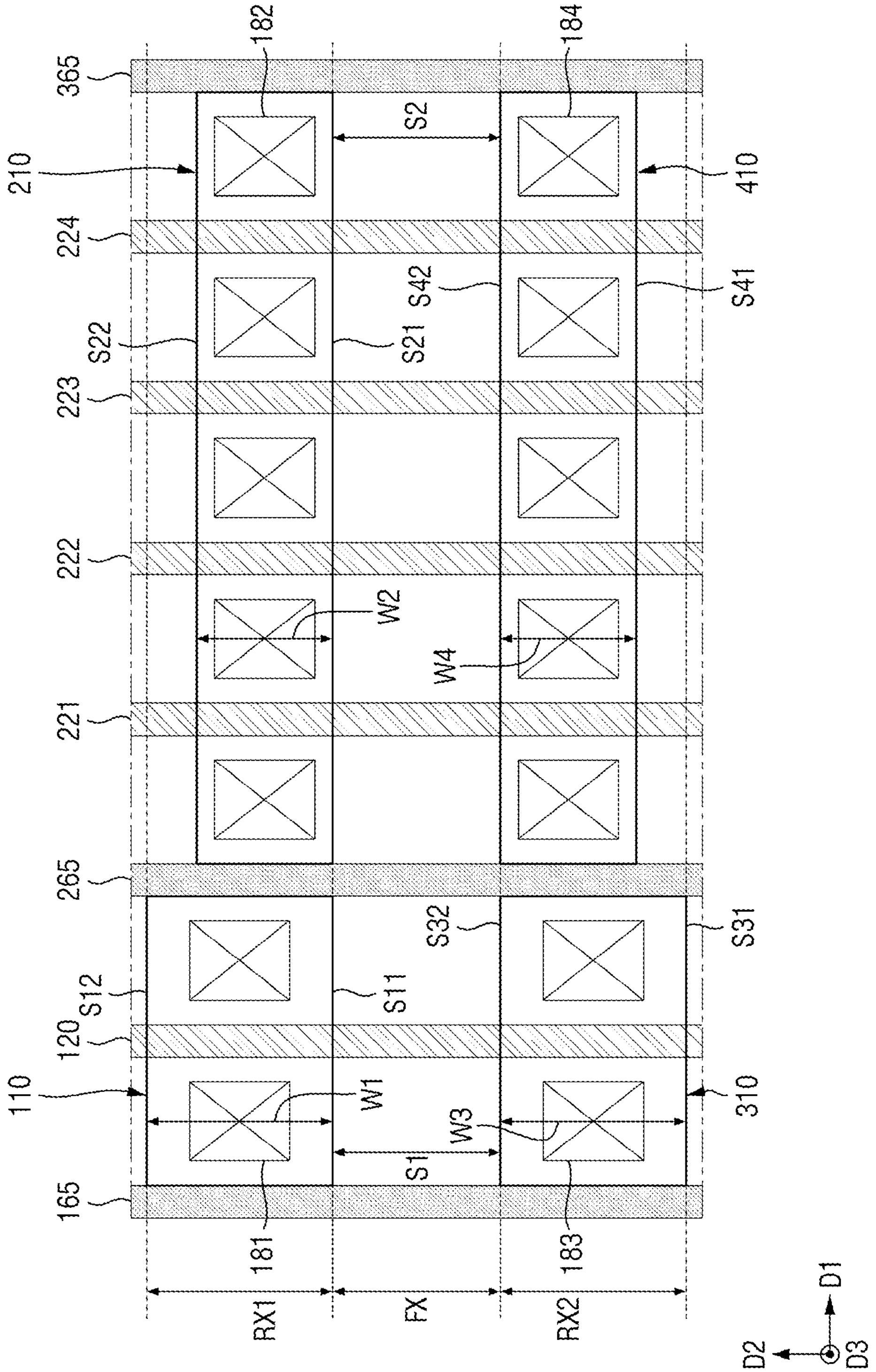
FIG. 13 is an exemplary layout view for describing a semiconductor device according to some exemplary embodiments.

FIG. 13 is an exemplary layout view for describing a semiconductor device according to some exemplary embodiments. For convenience of explanation, only points different from those described previously with reference to FIGS. 1 to 8 will be mainly described.

Referring to FIG. 13, in a semiconductor device according to some exemplary embodiments, the first active pattern 110 may have a shape including a portion protruding beyond the second active pattern 210 in the second direction D2, as viewed in a plan (top) view. For example, as illustrated in FIG. 13, the first-first sidewall S11 and the second-first sidewall S21 may be substantially disposed on the same plane (e.g., may be coplanar), and the first-second sidewall S12 and the second-second sidewall S22 may be disposed on different planes (e.g., may be offset from each other in the second direction D2 in a top view). The first-second sidewall S12 may be disposed to be higher (e.g., farther from the second active region RX2 in the second direction D2) than the second-second sidewall S22 in the second direction D2.

The third active pattern 310 may have a shape including a portion protruding beyond the fourth active pattern 410 in a direction opposite to the second direction D2, as viewed in a plan view. For example, as illustrated in FIG. 13, the third-first sidewall S31 and the fourth-first sidewall S41 may be disposed on different planes (e.g., may be offset from each other in the second direction D2 in a top view), and the third-second sidewall S32 and the fourth-second sidewall S42 may be substantially disposed on the same plane (e.g., may be colinear in a top view). The third-first sidewall S31 may be disposed to be lower (e.g., farther from the first active region RX1 in the second direction D2) than the fourth-first sidewall S41 in the second direction D2.

In other words, the distance S1 between the first active pattern 110 and the third active pattern 310 (in a region between the first element separation structure 165 and the second element separation structure 265) may be substantially the same as the distance S2 between the second active pattern 210 and the fourth active pattern 410 (in a region between the second element separation structure 265 and the third element separation structure 365).

Figure 14:
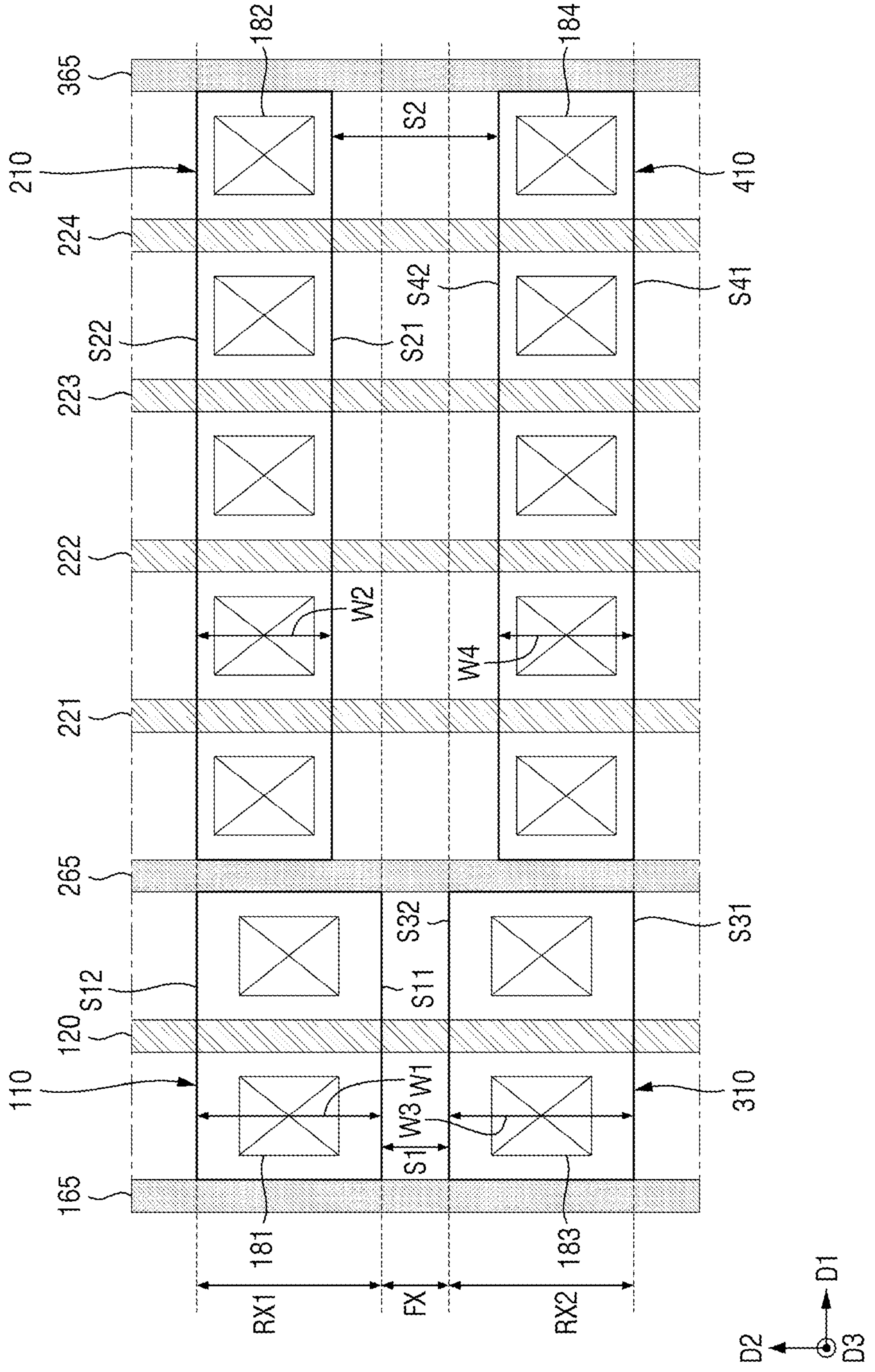
FIG. 14 is an exemplary layout view for describing a semiconductor device according to some exemplary embodiments.

FIG. 14 is an exemplary layout view for describing a semiconductor device according to some exemplary embodiments. For convenience of explanation, only points different from those described previously with reference to FIGS. 1 to 8 will be mainly described.

Referring to FIG. 14, in a semiconductor device according to some exemplary embodiments, the first active pattern 110 may have a shape including a portion protruding beyond the second active pattern 210 in a direction opposite to the second direction D2, as viewed in a plan view. The first-first sidewall S11 and the second-first sidewall S21 may be disposed on different planes (e.g., may be offset from each other in the second direction D2 in a top view), and the first-second sidewall S12 and the second-second sidewall S22 may be substantially disposed on the same plane (e.g., may be colinear in a top view). The first-first sidewall S11 may be disposed to be lower than the second-first sidewall S21 in the second direction D2.

The third active pattern 310 may have a shape including a portion protruding beyond the fourth active pattern 410 in a direction opposite to the second direction D2, as viewed in a plan view. The third-first sidewall S31 and the fourth-first sidewall S41 may be substantially disposed on the same plane (e.g., may be colinear in a top view), and the third-second sidewall S32 and the fourth-second sidewall S42 may be disposed on different planes (e.g., may be offset from each other in the second direction D2 in a top view). The third-second sidewall S32 may be disposed to be higher than the fourth-second sidewall S42 in the second direction D2.

Figure 15:
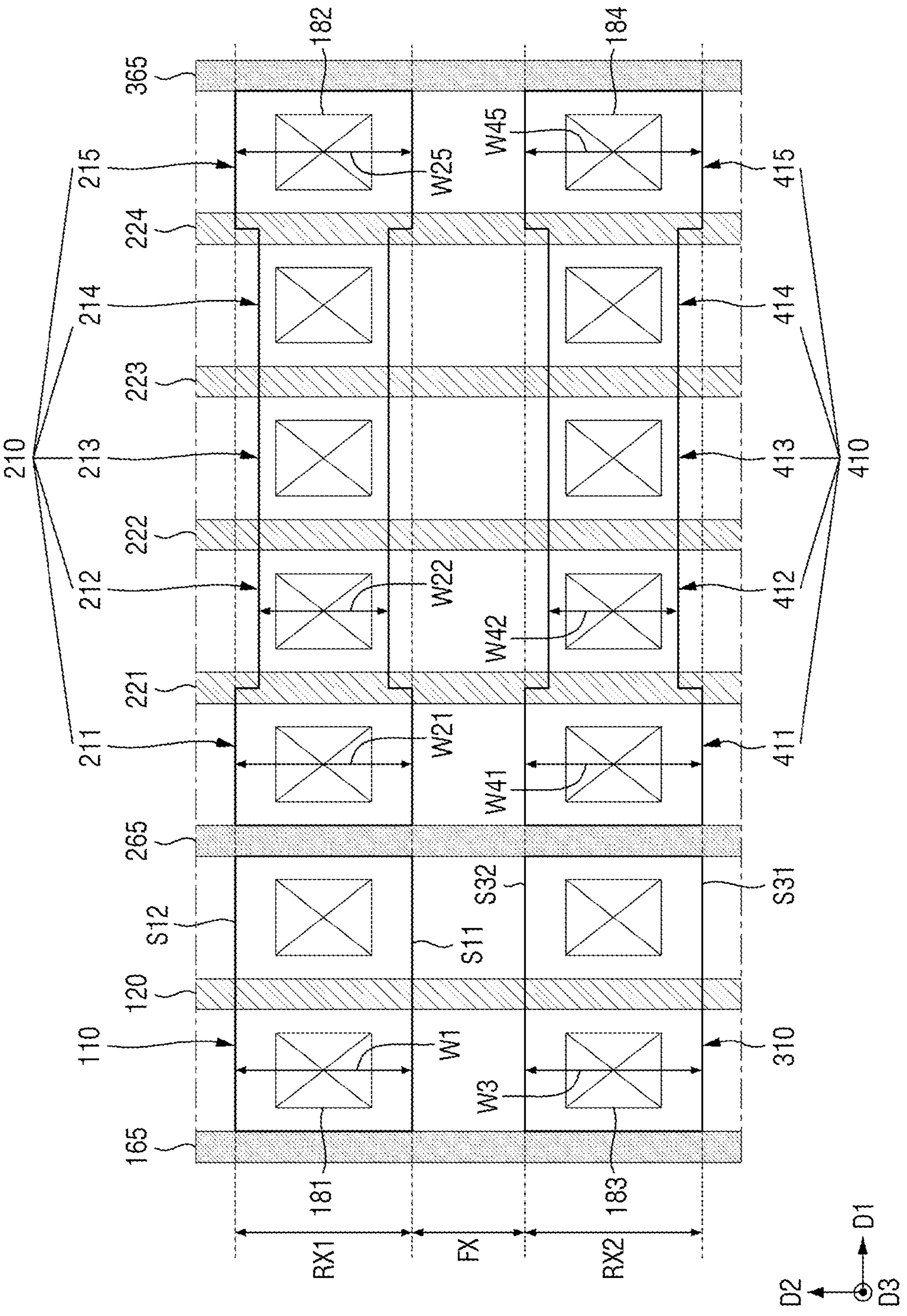
FIG. 15 is an exemplary layout view for describing a semiconductor device according to some exemplary embodiments.

FIG. 15 is an exemplary layout view for describing a semiconductor device according to some exemplary embodiments. For convenience of explanation, only points different from those described previously with reference to FIGS. 1 to 8 will be mainly described.

Referring to FIG. 15, in a semiconductor device according to some exemplary embodiments, each of the second active pattern 210 and the fourth active pattern 410 may include portions having different widths in the second direction D2. For example, as illustrated in FIG. 15, a width in the second direction D2 of a first part of each of the second active pattern 210 and the fourth active pattern 410 adjacent to the second element separation structure 265 or the third element separation structure 365 may be greater than a width of a second part of each of the second active pattern 210 and the fourth active pattern 410 that are not adjacent to the second element separation structure 265 and the third element separation structure 365. For example, a middle part of each of the second active pattern 210 and the fourth active pattern 410 may have a smaller width in the second direction D2 than edges of each of the second active pattern 210 and the fourth active pattern 410, e.g., the middle part of each of the second active pattern 210 and the fourth active pattern 410 may be between two opposite edges in the first direction D1.

For example, the second active pattern 210 may include a second-first portion 211 between the second element separation structure 265 and the second gate electrode 221, a second-second portion 212 between the second gate electrode 221 and the second gate electrode 222, a second-third portion 213 between the second gate electrode 222 and the second gate electrode 223, a second-fourth portion 214 between the second gate electrode 223 and the second gate electrode 224, and a second-fifth portion 215 between the second gate electrode 224 and the third element separation structure 365. A width W21 of the second-first portion 211 adjacent to the second element separation structure 265 in the second direction D2 and a width W25 of the second-fifth portion 215 adjacent to the third element separation structure 365 in the second direction D2 may be greater than a width W22 of the second-second to second-fourth portions 212, 213, and 214 that are not adjacent to the second element separation structure 265 and the third element separation structure 365 in the second direction D2. Although it is illustrated that the width W21 of the second-first portion 211 in the second direction D2 and the width W25 of the second-fifth portion 215 in the second direction D2 are substantially the same, this is merely for convenience of explanation.

For example, the fourth active pattern 410 may include a fourth-first portion 411 between the second element separation structure 265 and the second gate electrode 221, a fourth-second portion 412 between the second gate electrode 221 and the second gate electrode 222, a fourth-third portion 413 between the second gate electrode 222 and the second gate electrode 223, a fourth-fourth portion 414 between the second gate electrode 223 and the second gate electrode 224, and a fourth-fifth portion 415 between the second gate electrode 224 and the third element separation structure 365. A width W41 of the fourth-first portion 411 adjacent to the second element separation structure 265 in the second direction D2 and a width W45 of the fourth-fifth portion 415 adjacent to the third element separation structure 365 in the second direction D2 may be greater than a width W42 of the fourth-second to fourth-fourth portions 412, 413, and 414 that are not adjacent to the second element separation structure 265 and the third element separation structure 365 in the second direction D2. Although it is illustrated that the width W41 of the fourth-first portion 411 in the second direction D2 and the width W45 of the fourth-fifth portion 415 in the second direction D2 are substantially the same, this is merely for convenience of explanation.

In other words, a distance between the second-first portion 211 and the fourth-first portion 411 and a distance between the second-fifth portion 215 and the fourth-fifth portion 415 may be smaller than a distance between the second-second portion 212 and the fourth-second portion 412. The distance between the second-second portion 212 and the fourth-second portion 412 may be substantially the same as a distance between the second-third portion 213 and the fourth-third portion 413 and between the second-fourth portion 214 and the fourth-fourth portion 414.

In the semiconductor device according to some exemplary embodiments, a width W21 of the second-first portion 211 in the second direction D2 and a width W1 of the first active pattern 110 in the second direction D2 may be substantially the same. A width W41 of the fourth-first portion 411 in the second direction D2 and a width W3 of the third active pattern 310 in the second direction D2 may be substantially the same.

Figure 16:
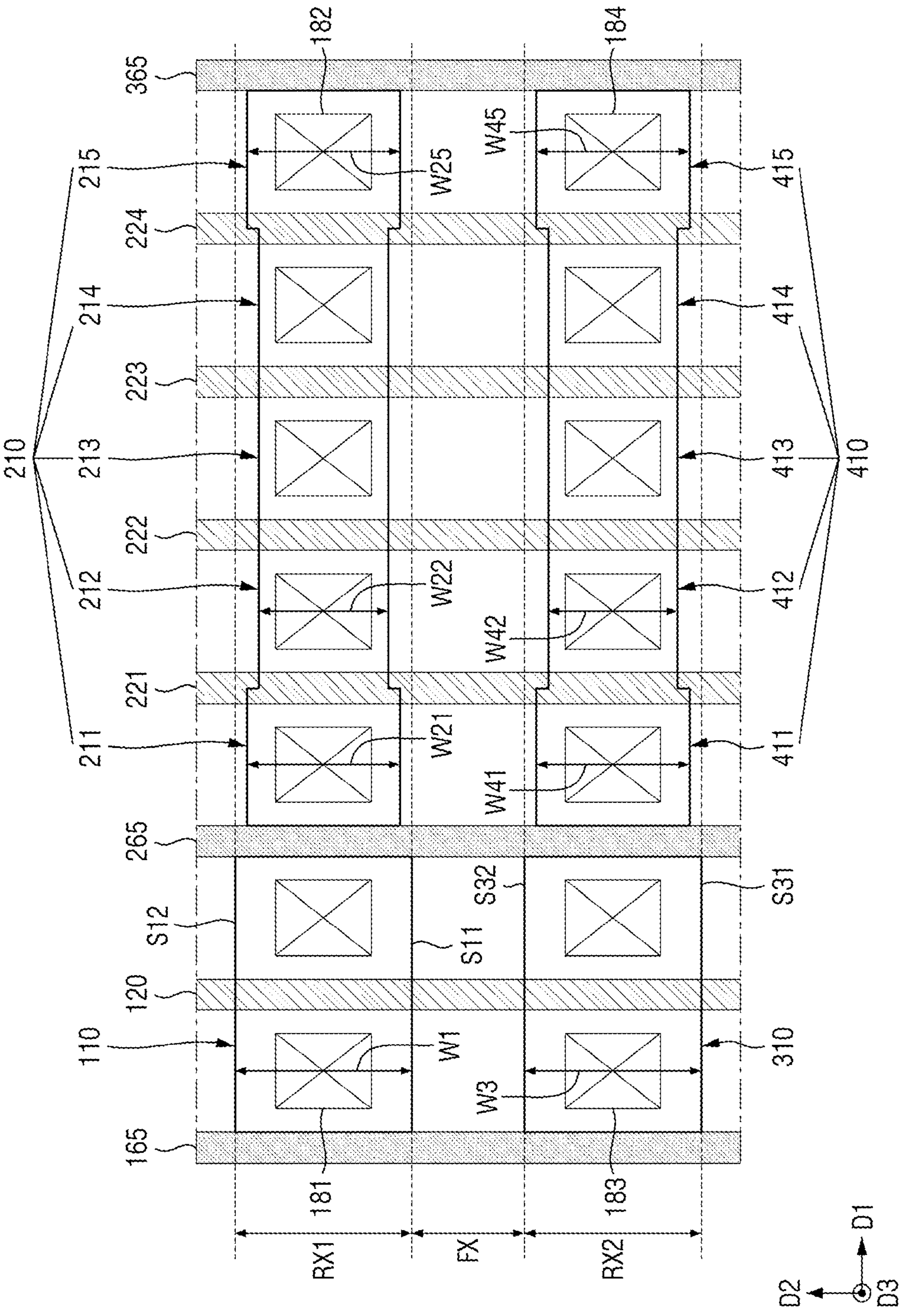
FIG. 16 is an exemplary layout view for describing a semiconductor device according to some exemplary embodiments.

FIG. 16 is an exemplary layout view for describing a semiconductor device according to some exemplary embodiments. For convenience of explanation, only portions different from those described previously with reference to FIG. 15 will be mainly described.

Referring to FIG. 16, in a semiconductor device according to some exemplary embodiments, the width W21 of the second-first portion 211 in the second direction D2 and the width W25 of the second-fifth portion 215 in the second direction D2 may be smaller than the width W1 of the first active pattern 110 in the second direction D2. The width W41 of the fourth-first portion 411 in the second direction D2 and the width W45 of the fourth-fifth portion 415 in the second direction D2 may be smaller than the width W3 of the third active pattern 310 in the second direction D2.

Figure 17:
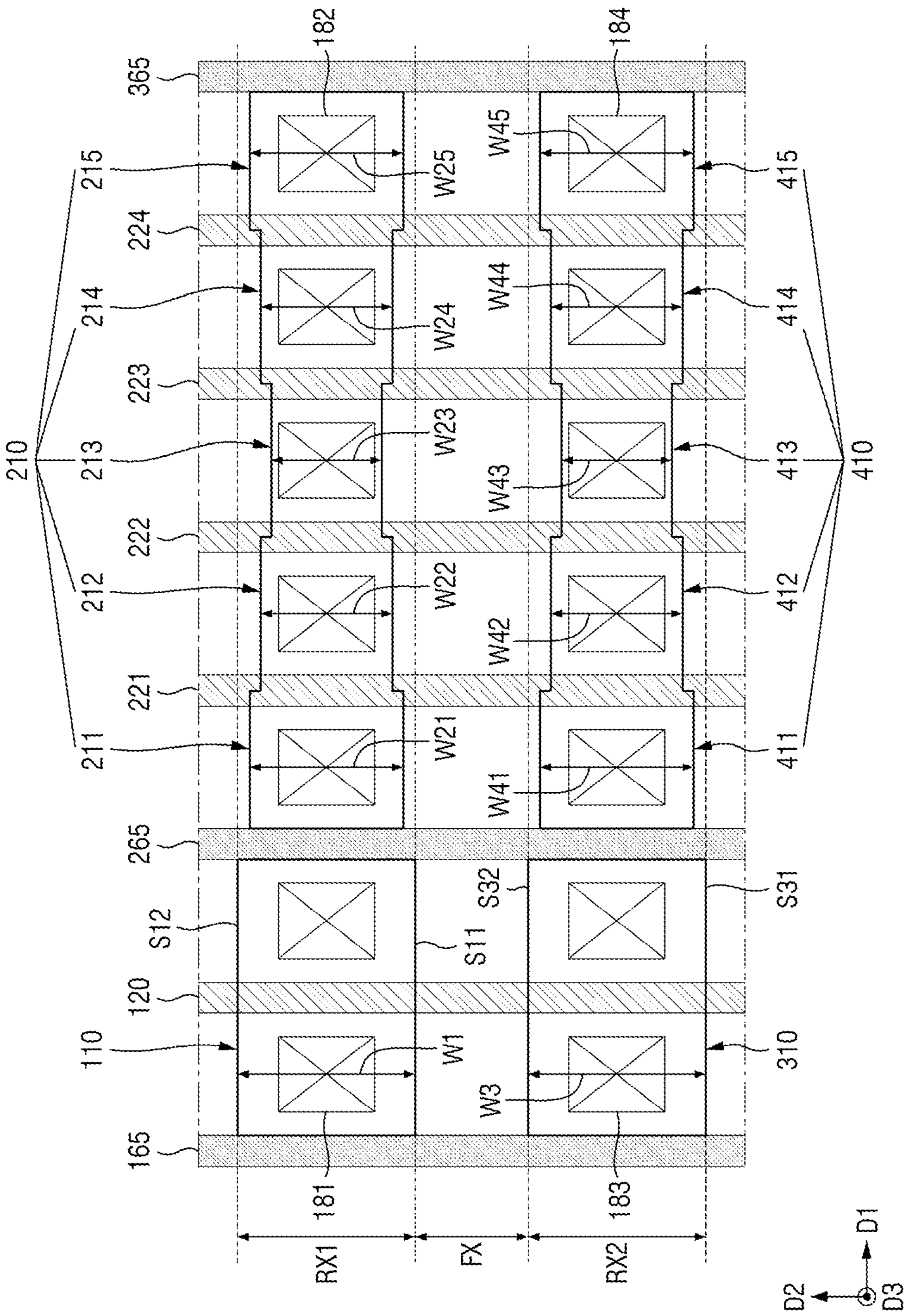
FIG. 17 is an exemplary layout view for describing a semiconductor device according to some exemplary embodiments.

FIG. 17 is an exemplary layout view for describing a semiconductor device according to some exemplary embodiments. For convenience of explanation, only portions different from those described previously with reference to FIG. 16 will be mainly described.

Referring to FIG. 17, in a semiconductor device according to some exemplary embodiments, the width of each of the second active pattern 210 and the fourth active pattern 410 may increase as a distance from the second element separation structure 265 or the third element separation structure 365 decreases.

For example, the width W21 of the second-first portion 211 adjacent to the second element separation structure 265 in the second direction D2 may be greater than the width W22 of the second-second portion 212 in the second direction D2, and the width W22 of the second-second portion 212 in the second direction D2 may be greater than the width W23 of the second-third portion 213 in the second direction D2. The width W25 of the second-fifth portion 215 adjacent to the third element separation structure 365 in the second direction D2 may be greater than the width W24 of the second-fourth portion 214 in the second direction D2, and the width W24 of the second-fourth portion 214 in the second direction D2 may be greater than the width W23 of the second-third portion 213 in the second direction D2. For example, the width W41 of the fourth-first portion 411 adjacent to the second element separation structure 265 in the second direction D2 may be greater than the width W42 of the fourth-second portion 412 in the second direction D2, and the width W42 of the fourth-second portion 412 in the second direction D2 may be greater than the width W43 of the fourth-third portion 413 in the second direction D2. The width W45 of the fourth-fifth portion 415 adjacent to the third element separation structure 365 in the second direction D2 may be greater than the width W44 of the fourth-fourth portion 414 in the second direction D2, and the width W44 of the fourth-fourth portion 414 in the second direction D2 may be greater than the width W43 of the fourth-third portion 413 in the second direction D2.

Figure 18:
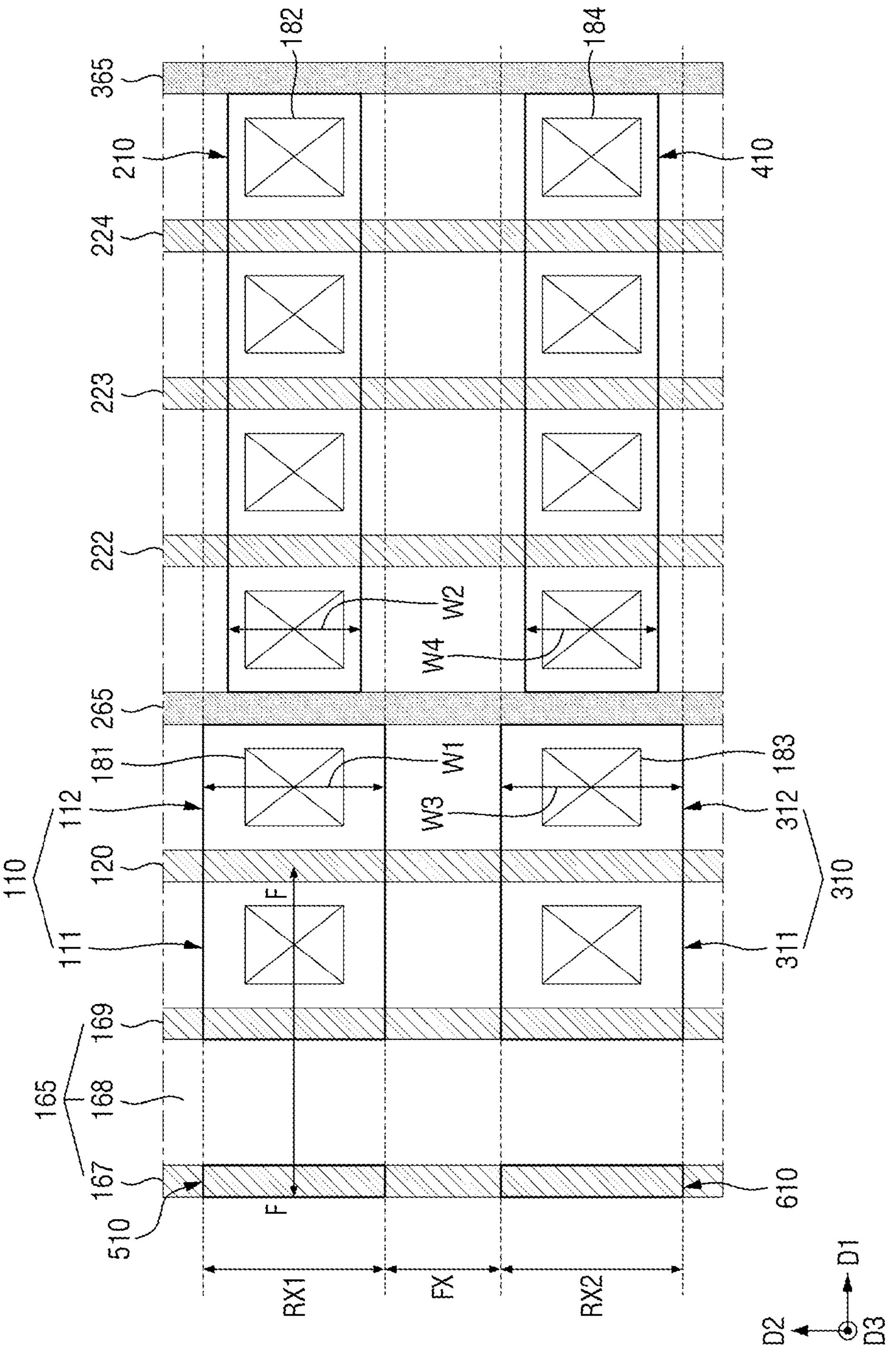
FIG. 18 is an exemplary layout view for describing a semiconductor device according to some exemplary embodiments.
Figure 19:
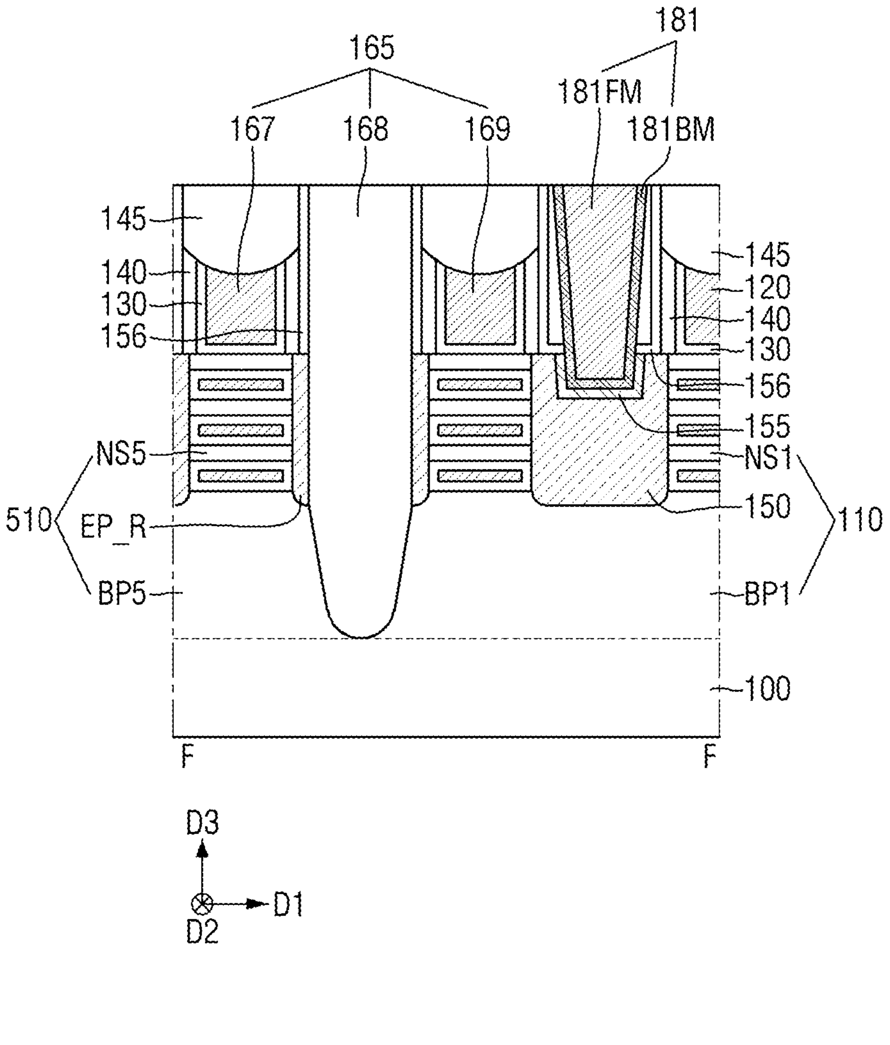
FIG. 19 is a cross-sectional view taken along line F-F of FIG. 18.

FIG. 18 is an exemplary layout view for describing a semiconductor device according to some exemplary embodiments. FIG. 19 is a cross-sectional view taken along line F-F of FIG. 18. For convenience of explanation, only points different from those described previously with reference to FIGS. 1 to 8 will be mainly described.

Referring to FIGS. 18 and 19, a semiconductor device according to some exemplary embodiments may further include a fifth active pattern 510 and a sixth active pattern 610.

The fifth active pattern 510 may be formed in the first active region RX1 of the substrate 100. The fifth active pattern 510 may extend along the first direction D1. The fifth active pattern 510 may be spaced apart from the first active pattern 110 in the first direction D1.

The sixth active pattern 610 may be formed in the second active region RX2 of the substrate 100. The sixth active pattern 610 may extend along the first direction D1. The sixth active pattern 610 may be spaced apart from the third active pattern 310 in the first direction D1.

Each of the fifth and sixth active patterns 510 and 610 may be a multi-channel active pattern. The fifth active pattern 510 may include a fifth lower pattern BP5 and a plurality of fifth sheet patterns NS5, and the sixth active pattern 610 may include a sixth lower pattern and a plurality of sheet patterns similarly to the fifth active pattern 510. A description of the fifth lower pattern BP5 and the plurality of fifth sheet patterns NS5 may be substantially the same as that of the first lower pattern BP1 and the plurality of first sheet patterns NS1. Since a description of the sixth active pattern 610 may be substantially the same as that of the fifth active pattern 510, the fifth active pattern 510 will be mainly described in the following description.

In a semiconductor device according to some exemplary embodiments, the first element separation structure 165 may include a first dummy gate electrode 167, a second dummy gate electrode 169, and an element separation layer 168.

The first dummy gate electrode 167 and the second dummy gate electrode 169 may be arranged to be spaced apart from each other along the first direction D1 at the first pitch. A pitch between the first dummy gate electrode 167 and the second dummy gate electrode 169 may be the same as a pitch between the second dummy gate electrode 169 and the first gate electrode 120.

Each of the first and second dummy gate electrodes 167 and 169 may extend, e.g., lengthwise, in the second direction D2. The first and second dummy gate electrodes 167 and 169 may be disposed on the first active region RX1 and the second active region RX2, respectively.

The first dummy gate electrode 167 may be disposed on the fifth and sixth active patterns 510 and 610. The first dummy gate electrode 167 may intersect the fifth and sixth active patterns 510 and 610. The first dummy gate electrode 167 may surround the fifth sheet pattern NS5 of the fifth active pattern 510 and the sheet pattern of the sixth active pattern 610.

The second dummy gate electrode 169 may be disposed on the first and third active patterns 110 and 310. The second dummy gate electrode 169 may intersect the first and third active patterns 110 and 310. The second dummy gate electrode 169 may surround the first sheet pattern NS1 of the first active pattern 110 and the sheet pattern of the third active pattern 310.

The first and second dummy gate electrodes 167 and 169 may not be disposed on the field insulating layer 105 between the fifth active pattern 510 and the first active pattern 110 and the field insulating layer 105 between the sixth active pattern 610 and the third active pattern 310.

The first and second dummy gate electrodes 167 and 169 may include the same material as the first gate electrode 120 or the plurality of second gate electrodes 221, 222, 223 and 224, respectively.

The element separation layer 168 may be disposed between the first dummy gate electrode 167 and the second dummy gate electrode 169. The element separation layer 168 may extend in the second direction D2. The element separation layer 168 may be disposed on the first active region RX1 and the second active region RX2. The element separation layer 168 may separate the fifth active pattern 510 and the first active pattern 110, and may separate the sixth active pattern 610 and the third active pattern 310.

For example, as illustrated in FIG. 19, a source/drain pattern EP_R may remain along a portion of a sidewall of the element separation layer 168. In another example, the source/drain pattern EP_R may not be disposed on the sidewall of the element separation layer 168.

For example, as illustrated in FIG. 19, the etch stop layer 156 may extend along a portion of the sidewall of the element separation layer 168. In another example, the etch stop layer 156 may not extend on the sidewall of the element separation layer 168.

The element separation layer 168 may include, e.g., at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), aluminum oxide (AlO), and a combination thereof. The element separation layer 168 is illustrated as a single layer, but may include multiple layers.

The gate insulating layer 130 may extend along a top surface of the fifth lower pattern BP5. The gate insulating layer 130 may surround the fifth sheet pattern NS5. The gate insulating layer 130 may be disposed along a circumference of the fifth sheet pattern NS5. The gate insulating layer 130 may be disposed between the first dummy gate electrode 167 and the fifth sheet pattern NS5, and between the second dummy gate electrode 169 and the first sheet pattern NS1.

The gate spacer 140 may be disposed on a sidewall of each of the first and second dummy gate electrodes 167 and 169. The gate capping pattern 145 may be disposed on each of the first and second dummy gate electrodes 167 and 169.

Figure 20:
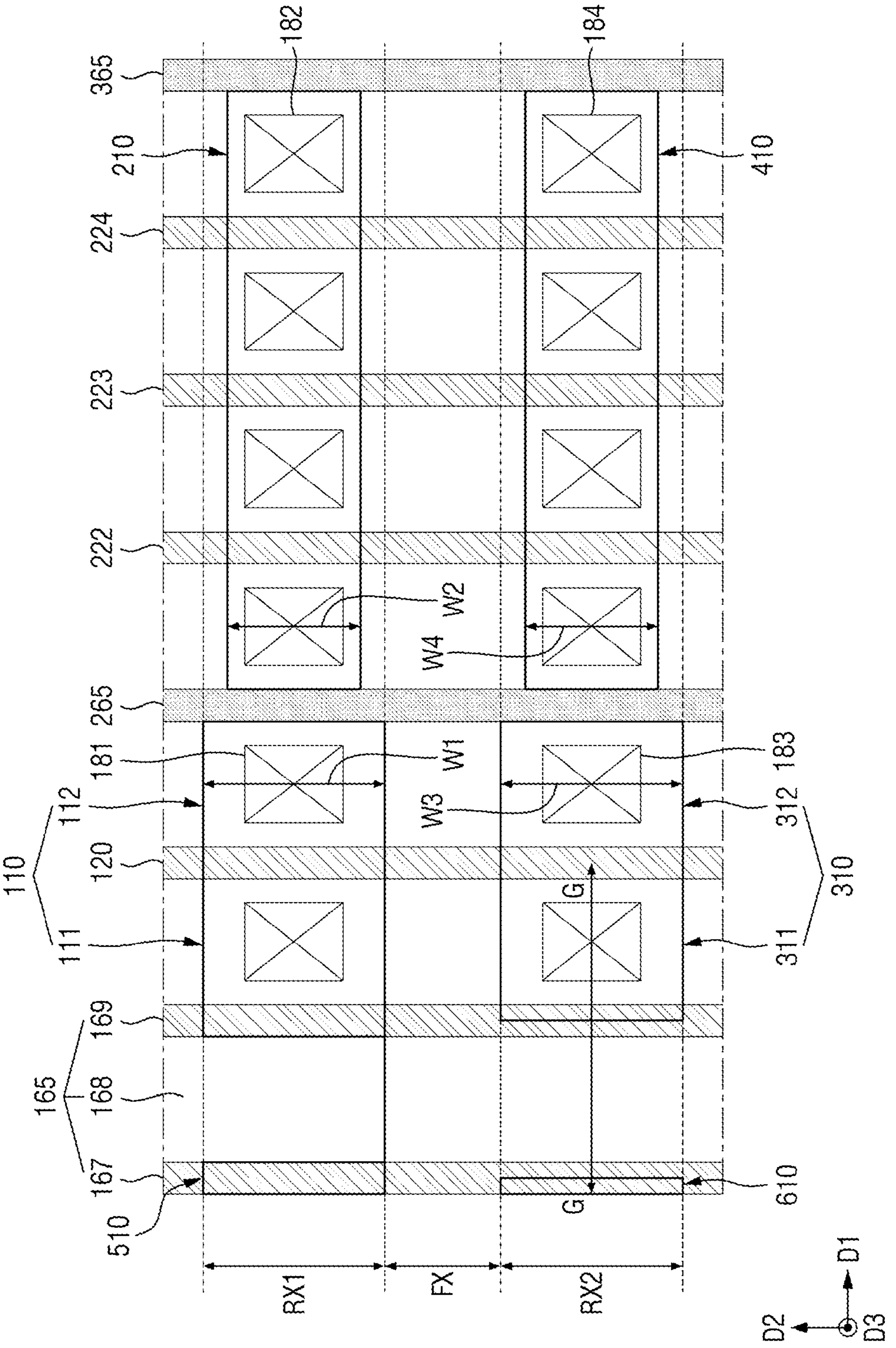
FIG. 20 is an exemplary layout view for describing a semiconductor device according to some exemplary embodiments.
Figure 21:
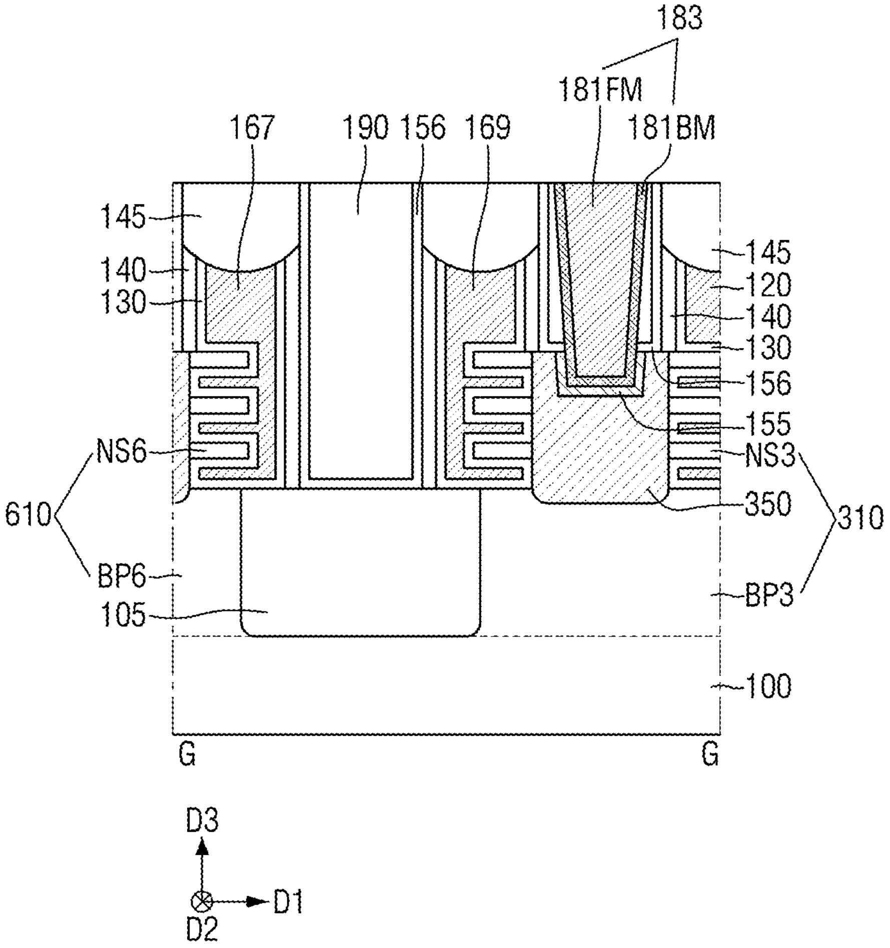
FIG. 21 is a cross-sectional view taken along line G-G of FIG. 20.

FIG. 20 is an exemplary layout view for describing a semiconductor device according to some exemplary embodiments. FIG. 21 is a cross-sectional view taken along line G-G of FIG. 20. For convenience of explanation, only points different from those described previously with reference to FIGS. 1 to 8 will be mainly described.

Referring to FIGS. 20 and 21, in a semiconductor device according to some exemplary embodiments, the element separation layer 168 may extend in the second direction D2 on the first active region RX1. The element separation layer 168 may separate the fifth active pattern 510 and the first active pattern 110.

The field insulating layer 105 may be disposed between the sixth active pattern 610 and the third active pattern 310. The field insulating layer 105 may separate the sixth active pattern 610 and the third active pattern 310. The field insulating layer 105 may separate a sixth lower pattern BP6 of the sixth active pattern 610 and the third lower pattern BP3 of the third active pattern 310.

The first dummy gate electrode 167 may be disposed on the sixth active pattern 610 and the field insulating layer 105. The first dummy gate electrode 167 may be disposed on an end including a short side of the sixth active pattern 610 and the field insulating layer 105 between the sixth active pattern 610 and the third active pattern 310. The first dummy gate electrode 167 may be disposed on sidewalls of a plurality of sixth sheet patterns NS6. The first dummy gate electrode 167 may completely surround end portions of the plurality of sixth sheet patterns NS6. At least a portion of the first dummy gate electrode 167 may be disposed on the field insulating layer 105 between the sixth active pattern 610 and the third active pattern 310.

The second dummy gate electrode 169 may be disposed on the field insulating layer 105 and the third active pattern 310. The second dummy gate electrode 169 may be disposed on the field insulating layer 105 between the sixth active pattern 610 and the third active pattern 310 and an end including a short side of the third active pattern 310. The second dummy gate electrode 169 may be disposed on sidewalls of a plurality of third sheet patterns NS3. The second dummy gate electrode 169 may completely surround end portions of the plurality of third sheet patterns NS3. At least a portion of the second dummy gate electrode 169 may be disposed on the field insulating layer 105 between the sixth active pattern 610 and the third active pattern 310.

Figure 22:
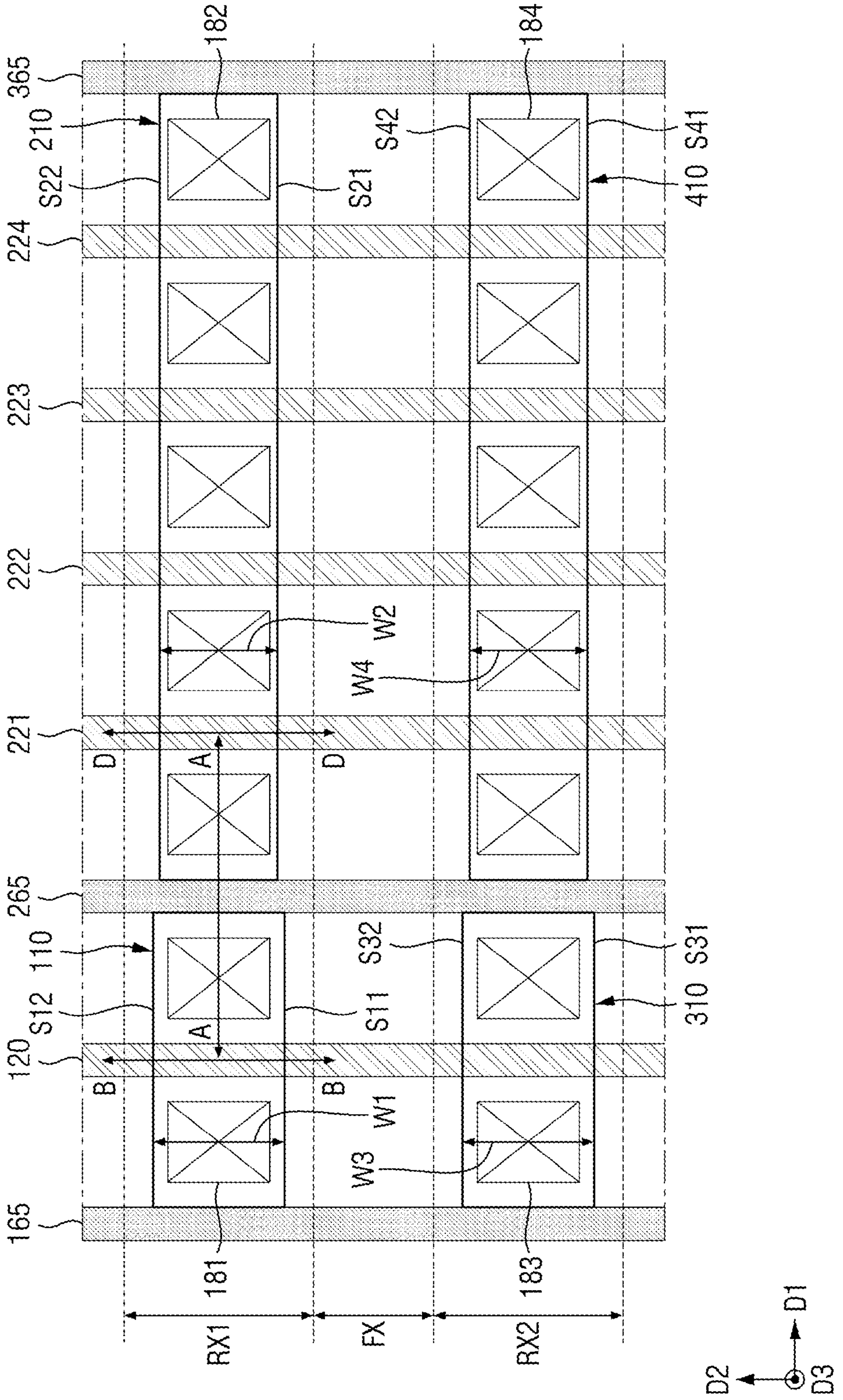
FIG. 22 is an exemplary layout view for describing a semiconductor device according to some exemplary embodiments.
Figure 23:
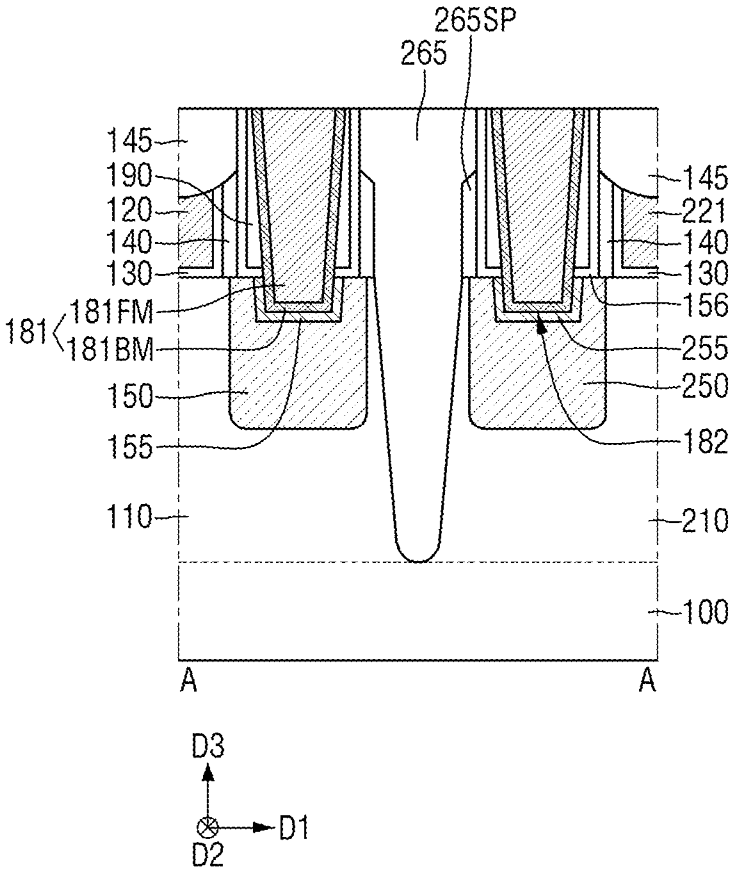
FIG. 23 is a cross-sectional view taken along line A-A of FIG. 22.
Figure 24:
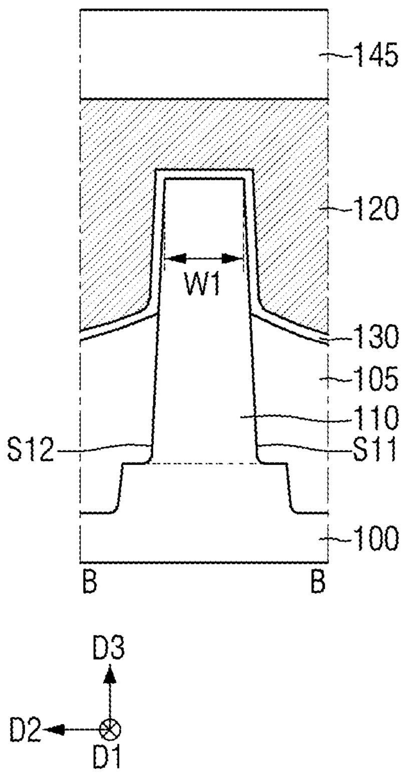
FIG. 24 is a cross-sectional view taken along line B-B of FIG. 22.
Figure 25:
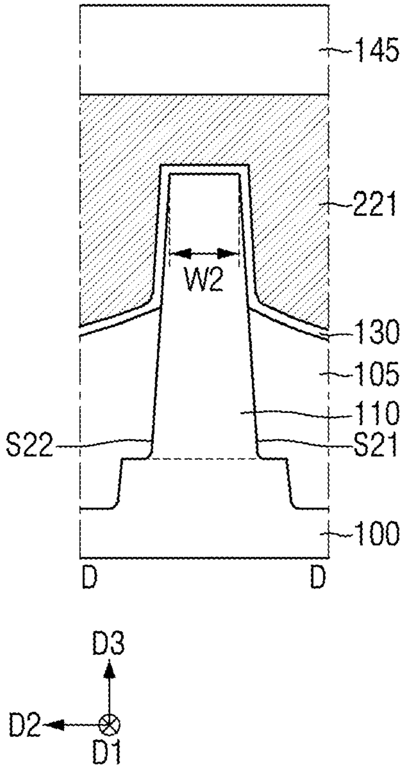
FIG. 25 is a cross-sectional view taken along line D-D of FIG. 22.

FIG. 22 is an exemplary layout view for describing a semiconductor device according to some exemplary embodiments. FIG. 23 is a cross-sectional view taken along line A-A of FIG. 22. FIG. 24 is a cross-sectional view taken along line B-B of FIG. 22. FIG. 25 is a cross-sectional view taken along line D-D of FIG. 22. For convenience of explanation, only points different from those described previously with reference to FIGS. 1 to 8 will be mainly described.

Referring to FIGS. 22 to 25, in a semiconductor device according to some exemplary embodiments, each of the first to fourth active patterns 110, 210, 310, and 410 may be a fin-shaped pattern. The number of first active patterns 110 and the number of second active patterns 210 formed in the first active region RX1 may be the same, and the number of third active patterns 310 and the number of fourth active patterns 410 formed in the second active region RX2 may be the same.

Although each of the first to fourth active patterns 110, 210, 310, and 410 is illustrated as one, it is merely for convenience of explanation and the present disclosure is not limited thereto. For example, each of the first to fourth active patterns 110, 210, 310, and 410 may be one or more.

The width W1 of the first active pattern 110 in the second direction D2 may be greater than the width W2 of the second active pattern 210 in the second direction D2. The width W1 of the first active pattern 110 in the second direction D2 may be a width of a top surface of the first active pattern 110 in the second direction D2, and the width W2 of the second active pattern 210 in the second direction D2 may be a width of a top surface of the second active pattern 210 in the second direction D2.

The width W3 of the third active pattern 310 in the second direction D2 may be greater than the width W4 of the fourth active pattern 410 in the second direction D2. The width W3 of the third active pattern 310 in the second direction D2 may be a width of a top surface of the third active pattern 310 in the second direction D2, and the width W4 of the fourth active pattern 410 in the second direction D2 may be a width of a top surface of the fourth active pattern 410 in the second direction D2.

By way of summation and review, embodiments provide a semiconductor device capable of having improved product reliability. That is, according to embodiments, a semiconductor device includes first and second active patterns arranged alternately with first through third separation structures in a first direction, such that a width of the first active pattern in a second direction (perpendicular to the first direction) is greater than a width of the second active pattern in the second direction.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a first element separation structure, a second element separation structure, and a third element separation structure sequentially spaced apart from each other in a first direction, the first element separation structure, the second element separation structure, and the third element separation structure extending in a second direction intersecting the first direction;

a first active pattern extending in the first direction between the first element separation structure and the second element separation structure;

a second active pattern extending in the first direction between the second element separation structure and the third element separation structure, the second active pattern being separated from the first active pattern by the second element separation structure, and a width of the first active pattern in the second direction being greater than a width of the second active pattern in the second direction;

a first gate electrode extending in the second direction on the first active pattern; and second gate electrodes extending in the second direction on the second active pattern.

2. The semiconductor device as claimed in claim 1, wherein:

the first active pattern includes a first sidewall and a second sidewall opposite to each other in the second direction, the second active pattern includes a third sidewall and a fourth sidewall opposite to each other in the second direction, and the first sidewall is on a same plane as the third sidewall.

3. The semiconductor device as claimed in claim 1, wherein:

the first active pattern includes a first sidewall and a second sidewall opposite to each other in the second direction, the second active pattern includes a third sidewall and a fourth sidewall opposite to each other in the second direction, and in a plan view, the first sidewall and the third sidewall are spaced apart from each other by a first width in the second direction, and the second sidewall and the fourth sidewall are spaced apart from each other by a second width different from the first width in the second direction.

4. The semiconductor device as claimed in claim 1, wherein:

the first active pattern includes a first sidewall and a second sidewall opposite to each other in the second direction, the second active pattern includes a third sidewall and a fourth sidewall opposite to each other in the second direction, and in a plan view, the first sidewall and the third sidewall are spaced apart from each other by a first width in the second direction, and the second sidewall and the fourth sidewall are spaced apart from each other by the first width in the second direction.

5. The semiconductor device as claimed in claim 1, wherein:

the width of the first active pattern in the second direction is constant as a distance from the second element separation structure increases, and the width of the second active pattern in the second direction is constant as a distance from the second element separation structure increases.

6. The semiconductor device as claimed in claim 1, wherein:

the second gate electrodes include a second-first gate electrode adjacent to the second element separation structure and a second-second gate electrode adjacent to the third element separation structure, the second active pattern includes a second-first portion between the second element separation structure and the second-first gate electrode, a second-second portion between the second-first gate electrode and the second-second gate electrode, and a second-third portion between the second-second gate electrode and the third element separation structure, and each of a width of the second-first portion in the second direction and a width of the second-third portion in the second direction is greater than a width of the second-second portion in the second direction and is smaller than the width of the first active pattern in the second direction.

7. The semiconductor device as claimed in claim 1, further comprising:

a first source/drain contact on the first active pattern; and a second source/drain contact on the second active pattern, a length of the first source/drain contact in the second direction being smaller than a length of the second source/drain contact in the second direction.

8. The semiconductor device as claimed in claim 1, further comprising:

a first source/drain contact on the first active pattern; and a second source/drain contact on the second active pattern, a length of the first source/drain contact in the second direction being equal to a length of the second source/drain contact in the second direction.

9. The semiconductor device as claimed in claim 1, further comprising a third active pattern extending in the first direction, wherein the first element separation structure includes:

a first dummy gate electrode extending in the second direction and on the third active pattern, a second dummy gate electrode extending in the second direction and on the first active pattern, and an element separation layer separating the first active pattern and the third active pattern between the first dummy gate electrode and the second dummy gate electrode.

10. The semiconductor device as claimed in claim 1, wherein:

the first active pattern includes a first lower pattern extending in the first direction, and a plurality of first sheet patterns spaced apart from the first lower pattern, the second active pattern includes a second lower pattern extending in the first direction, and a plurality of second sheet patterns spaced apart from the second lower pattern, the first gate electrode surrounds the plurality of first sheet patterns, the second gate electrodes surround the plurality of second sheet patterns, the width of the first active pattern in the second direction is a width of a top surface of the first lower pattern in the second direction, and the width of the second active pattern in the second direction is a width of a top surface of the second lower pattern in the second direction.

11. A semiconductor device, comprising:

a first element separation structure;

a second element separation structure spaced apart from the first element separation structure in a first direction;

a first active pattern extending in the first direction between the first element separation structure and the second element separation structure;

a second active pattern extending in the first direction and separated from the first active pattern by the second element separation structure;

a first gate electrode extending in a second direction on the first active pattern;

a second gate electrode extending in the second direction on the second active pattern; and a third gate electrode extending in the second direction on the second active pattern and spaced apart from the second gate electrode in the first direction, wherein the first element separation structure, the first gate electrode, the second element separation structure, the second gate electrode, and the third gate electrode are arranged at a first pitch along the first direction, and wherein a width of the first active pattern in the second direction is greater than a width of the second active pattern between the second gate electrode and the third gate electrode in the second direction.

12. The semiconductor device as claimed in claim 11, wherein the width of the first active pattern in the second direction is greater than or equal to a width of the second active pattern between the second element separation structure and the second gate electrode in the second direction.

13. The semiconductor device as claimed in claim 11, wherein a width of the second active pattern between the second element separation structure and the second gate electrode in the second direction is greater than or equal to the width of the second active pattern between the second gate electrode and the third gate electrode in the second direction.

14. The semiconductor device as claimed in claim 11, wherein:

the first active pattern includes a first sidewall and a second sidewall opposite to each other in the second direction, the second active pattern between the second gate electrode and the third gate electrode includes a third sidewall and a fourth sidewall opposite to each other in the second direction, and the first sidewall is disposed on the same plane as the third sidewall.

15. The semiconductor device as claimed in claim 11, wherein an entirety of the second active pattern overlaps the first active pattern in the first direction.

16. The semiconductor device as claimed in claim 11, further comprising: a first source/drain contact on the first active pattern; and a second source/drain contact on the second active pattern, a length of the first source/drain contact in the second direction being smaller than a length of the second source/drain contact in the second direction.

17. A semiconductor device, comprising:

a first element separation structure, a second element separation structure, and a third element separation structure sequentially spaced apart from each other along a first direction, each of the first element separation structure, the second element separation structure, and the third element separation structure extending in a second direction intersecting the first direction;

a first active pattern extending in the first direction between the first element separation structure and the second element separation structure;

a second active pattern extending in the first direction between the second element separation structure and the third element separation structure and spaced apart from the first active pattern in the first direction;

a third active pattern extending in the first direction between the first element separation structure and the second element separation structure and spaced apart from the first active pattern in the second direction;

a fourth active pattern extending in the first direction between the second element separation structure and the third element separation structure and spaced apart from the third active pattern in the first direction;

a first gate electrode extending in the second direction on the first active pattern and the third active pattern; and second gate electrodes extending in the second direction on the second active pattern and the fourth active pattern, wherein:

the second active pattern includes a first portion between the second gate electrodes adjacent to each other in the first direction, the fourth active pattern includes a second portion between the second gate electrodes adjacent to each other in the first direction, a width of the first active pattern in the second direction is greater than a width of the first portion in the second direction, and a width of the third active pattern in the second direction is greater than a width of the second portion in the second direction.

18. The semiconductor device as claimed in claim 17, wherein;

the first active pattern includes a first sidewall and a second sidewall opposite to each other in the second direction, the first portion includes a third sidewall and a fourth sidewall opposite to each other in the second direction, the second active pattern includes a fifth sidewall and a sixth sidewall opposite to each other in the second direction, the second portion includes a seventh sidewall and an eighth sidewall opposite to each other in the second direction, the first sidewall faces the sixth sidewall in the second direction, the third sidewall faces the eighth sidewall in the second direction, and in a plan view, the second sidewall is higher than the fourth sidewall in the second direction, the first sidewall is disposed to be lower than the third sidewall in the second direction, the sixth sidewall is disposed to be higher than the eighth sidewall in the second direction, and the fifth sidewall is disposed to be lower than the seventh sidewall in the second direction.

19. The semiconductor device as claimed in claim 17, wherein:

the first active pattern includes a first sidewall and a second sidewall opposite to each other in the second direction, the first portion includes a third sidewall and a fourth sidewall opposite to each other in the second direction, the second active pattern includes a fifth sidewall and a sixth sidewall opposite to each other in the second direction, the second portion includes a seventh sidewall and an eighth sidewall opposite to each other in the second direction, the first sidewall faces the sixth sidewall in the second direction, the third sidewall faces the eighth sidewall in the second direction, the second sidewall is coplanar with the fourth sidewall, and the fifth sidewall is coplanar with the seventh sidewall.

20. The semiconductor device as claimed in claim 17, wherein:

the first active pattern includes a first sidewall and a second sidewall opposite to each other in the second direction, the first portion includes a third sidewall and a fourth sidewall opposite to each other in the second direction, the second active pattern includes a fifth sidewall and a sixth sidewall opposite to each other in the second direction, the second portion includes a seventh sidewall and an eighth sidewall opposite to each other in the second direction, the first sidewall faces the sixth sidewall in the second direction, the third sidewall faces the eighth sidewall in the second direction, the first sidewall is coplanar with the third sidewall, and the sixth sidewall is coplanar with the eighth sidewall.

* * * * *